(12) United States Patent
Wadaka et al.

(10) Patent No.: US 6,963,155 B1
(45) Date of Patent: Nov. 8, 2005

(54) FILM ACOUSTIC WAVE DEVICE, MANUFACTURING METHOD AND CIRCUIT DEVICE

(75) Inventors: Shusou Wadaka, Tokyo (JP); Koichiro Misu, Tokyo (JP); Tsutomu Nagatsuka, Tokyo (JP); Tomonori Kimura, Tokyo (JP); Shumpei Kameyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1015 days.

(21) Appl. No.: 09/202,070

(22) PCT Filed: Apr. 24, 1997

(86) PCT No.: PCT/JP97/01442

§ 371 (c)(1),
(2), (4) Date: Dec. 8, 1998

(87) PCT Pub. No.: WO98/48464

PCT Pub. Date: Oct. 29, 1998

(51) Int. Cl.[7] .............................................. H01L 41/08
(52) U.S. Cl. ..................... 310/312; 29/25.35; 310/320; 310/366
(58) Field of Search ................................ 310/312, 320, 310/324, 365, 366–369, 334, 322; 29/25.35

(56) References Cited

U.S. PATENT DOCUMENTS

| | | | | |
|---|---|---|---|---|
| 2,799,789 A | * | 7/1957 | Wolfskill ..................... | 310/312 |
| 3,401,275 A | * | 9/1968 | Curran et al. ............... | 310/320 |
| 3,676,724 A | * | 7/1972 | Berlincourt et al. ........ | 310/320 |
| 4,320,365 A | | 3/1982 | Black et al. ................. | 333/187 |
| 4,427,515 A | | 1/1984 | Yuhara et al. | |
| 4,435,441 A | | 3/1984 | Mariani et al. .............. | 427/10 |
| 4,468,582 A | * | 8/1984 | Fujiwara et al. ............ | 310/365 |
| 4,642,508 A | * | 2/1987 | Suzuki et al. ........... | 310/324 X |
| 5,059,847 A | | 10/1991 | Tanaka et al. | |
| 5,065,065 A | | 11/1991 | Hikita et al. | |
| 5,075,641 A | * | 12/1991 | Weber et al. ........... | 310/324 X |
| 5,160,870 A | * | 11/1992 | Carson et al. .......... | 310/324 X |
| 5,185,589 A | * | 2/1993 | Krishnaswamy et al. ....................... | 310/324 X |
| 5,194,836 A | * | 3/1993 | Vale et al. .............. | 310/324 X |
| 5,692,279 A | * | 12/1997 | Mang et al. ............ | 310/324 X |

FOREIGN PATENT DOCUMENTS

| | | |
|---|---|---|
| EP | A 10-755085 | 1/1997 |
| JP | 61 269410 | 11/1986 |
| JP | A 62-78904 | 4/1987 |
| JP | A 62-122405 | 6/1987 |
| JP | 63 18708 | 1/1988 |
| JP | A 1-103012 | 4/1989 |
| JP | A 1-231411 | 9/1989 |

(Continued)

OTHER PUBLICATIONS

Copy of Office Action from Canadian Intellectual Property Office, May 28, 2001.

(Continued)

*Primary Examiner*—Mark Budd
(74) *Attorney, Agent, or Firm*—Birch, Stewart, Kolasch & Birch, LLP

(57) ABSTRACT

A film acoustic wave device having similar properties are obtained by changing at least one of the length and/or the width of upper electrodes; the distance between the upper electrodes; the length and/or the width of connecting patterns; the areas of bonding pads; and the pattern shape for the film acoustic wave device such as the area of capacitor electrodes electrically connected to the bonding pads. Property variations of the film acoustic wave devices caused from the positioning at a wafer is compensated for.

18 Claims, 33 Drawing Sheets

FOREIGN PATENT DOCUMENTS

| JP | 2 189011 | | 7/1990 | |
|----|----------|---|--------|---|
| JP | 5-259804 | * | 10/1993 | ............... 310/366 |
| JP | A 6-204776 | | 7/1994 | |
| JP | 406252691 | * | 9/1994 | ............... 310/365 |
| JP | A 8-274573 | | 10/1996 | |

OTHER PUBLICATIONS

"Effects of Aluminum Thickness on Temperature Characteristics of Surface Acoustic Wave Devices on the LST-Cut of Quartz," M. Murota et al., The Journal of Institute of Electronics, Information and Communication Engineers, A vol. J74-A, No. 9, pp. 1359-1365, Sep. 1991.

"Analysis of Trapped-Energy Resonators and Monolithic Filters by the Equivalent Distributed-Constant Circuits," K Nakamura et al., The Journal of Institute of Electronics, Information and Communication Engineers, '76/11 vol. J59-A, No. 11, pp. 985-992.

"Energy-Trapping for Backward-Wave-Mode Thickness-Vibrations by Controlling Piezoelectric Reaction," H. Shimizu et al., The Journal of Institute of Electronics, Information and Communication Engineers, '79/1 vol. J62-A No. 1, pp. 8-15.

"Equivalent-Network Analyses of Engergy-Trapping of Backward-Wave Thickness Vibrations," K. Yamada et al., The Journal of Institute of Electronics, Information and Communication Engineers, '80/6, vol. J63-A, No. 6, pp. 327-334.

"Optimization of Quartz SAW Resonator Structure with Groove Gratings," Takehiko Uno et al., IEEE Transactions on Sonics and Ultrasonics, vol. SU-29, No. 6, Nov. 1982, pp. 299-310.

* cited by examiner

ETCHING OF ELECTRODE MATERIAL

FILM ACOUSTIC WAVE DEVICE, MANUFACTURING METHOD AND CIRCUIT DEVICE

This application is the national phase under 35 U.S.C. §371 of prior PCT International Application No. PCT/JP97/01442 which has an International filing date of Apr. 24, 1997 which designated the United States of America.

FIELD OF THE INVENTION

The invention relates to a film acoustic wave device such as a filter and a resonator that utilizes acoustic waves, and a manufacturing method of the film acoustic wave device.

BACKGROUND OF THE INVENTION

Using a conversion process from electric signals to acoustic waves for a piezoelectric material, the film acoustic wave device functions as a filter or a resonator.

FIGS. 34, 35, 36 and 37 are examples of conventional film acoustic wave devices of this type as disclosed in the Japanese examined patent publication "sho61-269410" (hereinafter document 1).

FIG. 34 is a configuration of the conventional bulk acoustic wave device of this type.

FIG. 35 is a cross-section cut through A—A of FIG. 34.

A description of the numbered components indicated in the figures follows: a glass substrate 1; a piezoelectric thin film 2 made of zinc oxide (ZnO); an interdigital transducer of input side 3; and an interdigital transducer of output side 4; electrode fingers 5; and opposing electrodes 6 made of aluminum (Al).

FIGS. 36 and 37 are graphs that show properties of this type of conventional film acoustic wave device of FIGS. 34 and 35. FIG. 36 shows a relationship between an acoustic velocity Vs and a normalized thickness of thin film kh. FIG. 37 shows a relationship of an electromechanical coupling constant $K^2$ and the normalized thickness of thin film.

FIGS. 38, 39 and 40 are examples of the conventional film acoustic wave devices of this type as disclosed in the Japanese unexamined patent publication "sho63-18708" (hereinafter document 2).

FIG. 38 is a cross-section similar to FIG. 35.

FIG. 39 shows a relationship between the acoustic velocity Vs and the normalized thickness of thin film for the conventional film acoustic wave device of FIG. 38. FIG. 40 shows a relationship of the electromechanical coupling constant $K^2$ and the normalized thickness of thin film.

FIGS. 41 and 42 are examples of the conventional acoustic wave devices of this type as disclosed in the Japanese unexamined patent publication "hei2-189011" (hereinafter document 3).

A description of the numbered components indicated in the figures follows: the electrode fingers 5; and a piezoelectric substrate 7.

An operation of the conventional film acoustic wave device is described using FIGS. 34 to 42.

In FIGS. 34 and 35, the electrode fingers 5 are placed on top of the glass substrate 1, and then the piezoelectric thin film 2 made of ZnO is placed on top of the two. An electric field is formed on an intersecting part of the electrode fingers 5 from electric signals applied to the interdigital transducer of input side 3. Due to the electric field, the piezoelectric thin film 2 is stretched to excite acoustic waves. The acoustic waves that have been excited at the interdigital transducers of input side 3 propagate in a direction parallel to a surface, and reaches the interdigital transducers of output side 4 accompanied by the electric field and the acoustic vibrations. At the interdigital transducers of output side 4, the electrode fingers 5 again receive the electric field which is formed by the acoustic waves, and change the electric field back to the electric signal. Since a reverse conversion of electric signals and acoustic waves is possible, the process of reverse conversion of the electric field made by the acoustic waves back to the electric signals is considered same as the case of the interdigital transducers of input side 3.

There are a number of modes for the propagation of acoustic waves through the piezoelectric thin film 2 as shown in FIG. 35. Example of the modes are: surface acoustic waves which propagate in the direction parallel to the surface due to a concentration of energy at the surface; bulk waves which propagate in the direction parallel to the surface; and the bulk waves which propagates in a direction of thickness. For any of these modes, intensities of acoustic wave excitations are determined by materials being used, combination of the materials, the physical dimensions such as thickness of each material, as well as the configuration of electrodes that excites the acoustic waves. The film acoustic wave device of FIG. 35 uses the surface acoustic waves. The configuration of electrode fingers 5 as shown in FIGS. 34 and 35 are commonly being used to excite the surface acoustic waves.

The efficiency of conversion from the electric signals which are applied to the interdigital transducers of input side 3 to the surface acoustic waves relates largely to the performance of the film acoustic wave device, and as one indicia that shows such conversion efficiency, there is the electromechanical coupling constant $K^2$. The larger the electromechanical coupling constant $K^2$, for example, the filters that are less damaging and have wide-ranging properties become possible. The electromechanical coupling constant $K^2$ is determined by the materials being used, the combination of the materials, the physical dimensions such as the thickness of each material, and the configuration of the electrode(s) that excites the acoustic waves.

The conventional film acoustic wave device of this type in document 1 uses $PbO$—$B_2O_3$ glass with a density of $\rho=5.7\pm0.3$, Lamé's constant $\mu=(0.48\pm0.02)\times10^{11} N/m^2$, Poisson's ratio $\sigma= 0.25$ as the glass substrate 1, as the electrode fingers 5 made of aluminum, and the piezoelectric thin film 2 made of ZnO. Thicknesses are: 0.1 $\mu m$ for the electrode fingers 5; 0.3~25.5 $\mu m$ for the piezoelectric thin film 2; and 0.1 $\mu m$ for the opposing electrodes 6. FIGS. 36 and 37 illustrate the properties of the film acoustic wave devices with this configuration, as described in the document 1.

FIG. 36 is a graph that shows a relationship between the acoustic velocity Vs and the normalized thickness of thin film kh. FIG. 37 is a graph that shows a relationship between the electromechanical coupling constant $K^2$ and the normalized thickness of thin film kh.

In this content, h refers to a thickness of piezoelectric thin film 2, and k refers to a wave number of the surface acoustic waves that propagate in the direction parallel to the surface. The normalized thickness of thin film kh is a multiple of the wave number k and the thickness h. Given that a wavelength of the acoustic wave is $\lambda$, and a frequency is f, the wave number k is $(2\pi/\lambda)$ or $(2\pi f/Vs)$, so under a fixed frequency f the wave number k is also a fixed number that the normalized thickness kh on a horizontal axis is possible to be substituted with the thickness h. That is, under a fixed frequency f, FIG. 36 is indicating a relationship of the acoustic velocity Vs and the thickness h of piezoelectric thin film 2, and even when the thickness h changes, the acoustic velocity Vs is fixed. Likewise, for a fixed frequency f, FIG. 37 is showing the relationship of the thickness h of piezoelectric thin film 2 and the electromechanical coupling constant $K^2$, and in a range of kh from 3 to 4, the electromechanical coupling constant $K^2$ is close to a maximum, indicating that it is also fixed.

Accordingly, by selecting materials of glass substrate 1, etc. as described previously, even if the thickness of piezoelectric thin film 2 varied, the acoustic velocity Vs and the electromechanical coupling constant $K^2$ for the film acoustic wave devices are almost fixed. The acoustic velocity Vs relates to a center frequency of the film acoustic wave device, and the electromechanical coupling constant $K^2$ largely relates to an insertion loss of the film acoustic wave device. Thus, within a range of the frequency f and the thickness h of piezoelectric thin film 2, the range of normalized thickness of the thin films kh is from 3 to 4 as in FIGS. 36 and 37, and the center frequency and the insertion loss of film acoustic wave device is approximately a fixed number.

FIG. 38 is showing the conventional film acoustic wave device of this type as in the document 2, and is a cross-sectional view similar to FIG. 35.

A description of the numbered components indicated in the figure follows: the glass substrate 1, the piezoelectric thin film 2 made of ZnO or aluminum nitride (AlN), and the electrode fingers 5 that make up the interdigital transducers.

Similar to FIGS. 34 and 35, the conventional film acoustic wave device of this type shown in FIG. 38 is using the surface acoustic waves. The configuration resembles the configuration shown in FIG. 35 where the electrode fingers 5 are placed on top of the glass substrate 1, and then place the piezoelectric thin film 2 on top of the two. However, in the example of FIG. 38, the opposing electrodes 6 are not placed on top of the piezoelectric thin film 2. The fact that the surface acoustic waves are excited by the electric field formed at the intersecting electrode fingers 5 is same as in FIGS. 34 and 35, but because the surface of piezoelectric thin film 2 has no metal on its surface, the film acoustic wave device of FIG. 38 has different properties from the example illustrated in FIGS. 34 and 35.

FIG. 39 shows a relationship of the normalized thickness of thin film kh and the acoustic velocity Vs. FIG. 40 shows a relationship of the normalized thickness of thin film kh and the electromechanical coupling constant $K^2$.

Although the materials being used and the configuration are similar to those of FIGS. 34 and 35, a reason for the film acoustic wave device illustrated in FIG. 38 being so different in properties from FIGS. 36 and 37 is the non-metallic surface of the piezoelectric thin film 2. A case illustrated in FIG. 39 is different from the case illustrated in FIG. 36, where the acoustic velocity Vs changes when the normalized thickness of thin film kh changed. On the other hand, at a region of the normalized thickness of thin film kh greater than 2, the electromechanical coupling constant $K^2$ becomes greater than 2. Therefore, when the thickness h of the piezoelectric thin film 2 is changed at the region of normalized thickness of thin film kh greater than 2, the acoustic velocity Vs changes but the electromechanical coupling constant $K^2$ does not change a great deal. This means the center frequency of the film acoustic wave device is adjusted by directly changing the thickness h of piezoelectric thin film 2. In document 2, as methods of adjusting the thickness h of piezoelectric thin film 2, for example, illustrates the use of a sputter to make a thicker film and a use of an etching method to make a thinner film. As long as the configuration is like those illustrated in FIG. 38, there will be no effect on the electrode fingers 5 by changing the thickness of piezoelectric thin film 2 using the etching or sputtering methods.

FIGS. 41 and 42 illustrate the conventional acoustic wave devices of this type as disclosed in document 3.

For those cases, the piezoelectric substrate 7 is used instead of the piezoelectric thin film 2. A numeral 5 is indicating the electrode fingers 5.

The conventional acoustic wave device of the type shown in FIG. 41 is the surface acoustic wave device used by exciting the surface acoustic waves by the electrode fingers 5. The velocity of surface acoustic waves that propagate through the electrode fingers 5 is known to have a different acoustic velocity from the acoustic velocity at a region where there is no electrode fingers 5, and this is due to the effects of a mass load and an electrical boundary condition of the electrode fingers 5. For the surface acoustic wave device of FIG. 41, by changing the thickness of electrode fingers 5 by etching the electrode material, the acoustic velocity is changed by the mass load effect, and then the center frequency of the surface acoustic wave device is adjusted. For a detailed description on the effects of change in frequency from the mass load effect, refer to "Journal of Electronics, Information and Communication Engineers of Japan A, Vol. J74-A, No. 9, pp. 1359~1365, September 1991" (hereinafter document 4).

For the conventional acoustic wave device of this type shown in FIG. 42, parts of the piezoelectric substrate 7 are scraped off where there is no electrode fingers 5 using the etching method, to adjust the center frequency. With such a structure where the surface of piezoelectric substrate 7 has been scraped off as in FIG. 42, in areas of different surface levels of the piezoelectric substrate 7, a delay is known to arise from an influence of stored energy on the surface acoustic waves that propagate through the different surfaces of piezoelectric substrate 7. The varied surface levels allows for an equivalent adjustment of the center frequency of the surface acoustic wave device. For a detailed description of the adjustment of center frequency from the etching method the surface of piezoelectric substrate 7, refer to "IEEE Transactions on Sonics and Ultrasonics, Vol. SU-29, No. 6, pp. 299~310, November 1982" (hereinafter document 5).

The Case of forming the piezoelectric thin film 2 and a metal electrode is described using FIGS. 43 and 44.

Standard processes of forming the piezoelectric thin film 2 and the metal electrode(s) are the sputtering and vacuum evaporation. In these methods of forming the films, looking from a target 8 of the sputter and vacuum evaporation, at a central portion of the wafer, the resulting film becomes relatively thick, and at a periphery of the wafer the resulting film becomes relatively thin. For example, as in FIG. 43 when the target 8 and the wafer 9 where the film components land are arranged one-to-one inside a vacuum container 10, then the formation of film in the central portion of wafer 9 has a thickness and of $h_c$ and the periphery of wafer 9 has a thickness of $h_e$, as shown in FIG. 44. Therefore, in this type of film acoustic wave device, the adjustment of frequency is needed to overcome the variation in the thickness of piezoelectric thin film and film formed on the metal electrode.

SUMMARY OF THE INVENTION

As explained previously, for the conventional film acoustic wave device of this type, types and combinations of materials for the glass substrate 1, the piezoelectric thin film 2 and the electrode fingers 5 were defined within the appropriate limit. By limiting the types, combinations and thickness within the allowed thickness change for the piezoelectric thin film 2, variations in the thickness of piezoelectric thin film 2 caused during manufacturing are dealt with by planning the film acoustic wave device in such a way that there will be no huge variations in its properties. However, in such a case there is a problem of not being able to use it for other types of film acoustic wave device other than the one geared to the defined limit of combinations and types of the materials for the glass substrate 1, the piezoelectric thin film 2 and the electrode 5, therefore, it could not have been adopted in a wide-ranging types of film acoustic wave devices.

Also, for the conventional acoustic wave devices, center frequencies are adjusted by changing the thickness of piezoelectric substrate 7 partially, the thickness of piezoelectric thin film 2 and the electrode fingers 5. Normally, for this type of the acoustic wave devices, a plurality of these devices are arranged on top of the wafer made of a single plate of glass substrate or the piezoelectric substrate 7, and the plurality of these devices are manufactured at once. From this, when need to partially change the thickness of piezoelectric thin film 2, the thickness of electrode fingers 5, and the thickness of piezoelectric conductor 7, the thickness are adjusted in a wafer unit or adjusted after separating the individual devices from each other for adjustment of every one of the devices. To carry out the adjustment for every devices, an additional adjustment expense is incurred directly on top of a cost of the device, therefore, it is not practical for the price of this type of the acoustic wave devices. If the thickness were adjusted in the wafer unit, it cannot be adopted in a case when the variation of thickness arose inside the wafer.

That is, when forming the metal electrode and the piezoelectric thin film using the sputtering and vacuum evaporation, as previously mentioned in FIG. 44, the films formed on top of the wafer 9 is thick at central portion and thin in its periphery. Such that in this type of film acoustic wave device, it is important to adjust frequency against the variation in thickness of films of metal electrode and piezoelectric thin film within the wafer, however, a problem in the conventional film acoustic wave device was that the adjustment was not possible.

The invention, in attempt to solve the problem, aims to provide a film acoustic wave device and a manufacturing method of film acoustic wave device that can adjust a variation of thickness inside the wafer, without increasing the manufacturing cost.

According to one aspect of the present invention, a film acoustic wave device comprises a wafer made of a semiconductor substrate, a ground electrode formed on top of the semiconductor substrate, a piezoelectric thin film formed on top of the ground electrode, and an upper electrode formed on top of the piezoelectric thin film. A pattern shape for the film acoustic wave device is changed by a position at the wafer.

According to another aspect of the present invention, a length of the upper electrode of the film acoustic wave device is changed by the position at the wafer.

According to another aspect of the present invention, a width of the upper electrode of the film acoustic wave device is changed by the position at the wafer.

According to another aspect of the present invention, the upper electrode of the film acoustic wave device includes a plurality of upper electrodes, and distances between the upper electrodes are changed by the position at the wafer.

According to another aspect of the present invention, the film acoustic wave device further comprises a bonding pad for connecting with the upper electrode. A shape of the bonding pad is changed by the position at the wafer.

According to another aspect of the present invention, the film acoustic wave device further comprises a connecting pattern for connecting the upper electrode with the bonding pad. A shape of the connecting pattern is changed by the position at the wafer.

According to another aspect of the present invention, the connecting pattern of the film acoustic wave device forms an air bridge.

According to another aspect of the present invention, the film acoustic wave device further comprises a capacitor provided on the same semiconductor substrate as the film acoustic wave device. A capacity of the condenser is changed by the position of the wafer.

According to another aspect of the present invention, the film acoustic wave device includes the followings: semiconductor substrate made of gallium arsenide (GaAs); the piezoelectric thin film made of lead titanate ($PbTiO_3$); and at least one of the upper electrodes and ground electrode which is a conductor substantially made of platinum (Pt).

According to another aspect of the present invention, the film acoustic wave device includes the followings: a semiconductor substrate made of silicon (Si); the piezoelectric thin film made of lead titanate ($PbTiO_3$); and at least one of the upper electrode and ground electrode which is a conductor substantially made of platinum (Pt).

According to another aspect of the present invention, the film acoustic wave device includes the followings: the piezoelectric thin film made of PZT($PbTiO_3$—$PbZrO_3$); and at least one of the upper electrode and the ground electrode which is a conductor substantially made of platinum (Pt).

According to another aspect of the present invention, the piezoelectric thin film of the film acoustic wave device is made of zinc oxide (ZnO).

According to another aspect of the present invention, the piezoelectric thin film of the film acoustic wave device is made of aluminum nitride (AlN).

According to another aspect of the present invention, the film acoustic wave device further comprises an inductor between the semiconductor substrate and the ground electrode.

According to another aspect of the present invention, a circuit device comprises a substrate, and a plurality of elements formed on the substrate. The pattern shape of the elements formed on the substrate is changed by a position at the substrate.

According to another aspect of the present invention, a manufacturing method of the film acoustic wave device comprises of the following steps:

(a) forming a ground electrode on top of a wafer made of a semiconductor substrate;

(b) forming a piezoelectric thin film on top of the ground electrode;

(c) forming an upper electrode on top of the piezoelectric thin film; and (d) changing a pattern shape of the upper electrode formed on top of the piezoelectric thin film by the position at the wafer.

According to another aspect of the present invention, the manufacturing method of the film acoustic wave device includes the step of changing the pattern shape. The step includes a step of changing the length of the upper electrode by the position at the wafer.

According to another aspect of the present invention, the manufacturing method of the film acoustic wave device includes the step of changing the pattern shape. The step includes a step of changing the width of the upper electrode by the position at the wafer.

According to another aspect of the present invention, the manufacturing method of the film acoustic wave device includes the step of forming the upper electrode which forms a plurality of upper electrodes. The step of changing the pattern shape includes a step of changing the distance between the upper electrodes by the position at the wafer.

According to another aspect of the present invention, the manufacturing method of the film acoustic wave device includes the step of forming the upper electrode. This step further includes a step of connecting of the upper electrode to a bonding pad. As well, the manufacturing method of the film acoustic wave device includes step of changing the pattern shape. This step further includes a step of changing a shape of the bonding pad by the position at the wafer.

According to another aspect of the present invention, the manufacturing method of the film acoustic wave device includes the step of forming the upper electrode. This step further includes the connecting the upper electrode and the bonding pad to a connecting pattern. As well, the manufacturing method of the film acoustic wave device includes the step of changing the pattern shape. This step further includes a step of changing a shape of the connecting pattern by the position at the wafer.

According to another aspect of the present invention, the manufacturing method of the film acoustic wave device includes the step of changing the pattern shape which further includes a step of forming the connecting pattern with the air bridge.

According to another aspect of the present invention, the manufacturing method of the film acoustic wave device further comprises a step for setting a capacitor on the same semiconductor substrate as the film acoustic wave device. The step of changing the pattern shape further includes a step of changing a capacity of the condenser by the position at the wafer.

BEST MODE FOR CARRYING OUT THE INVENTION

Embodiment 1

Figure 1:
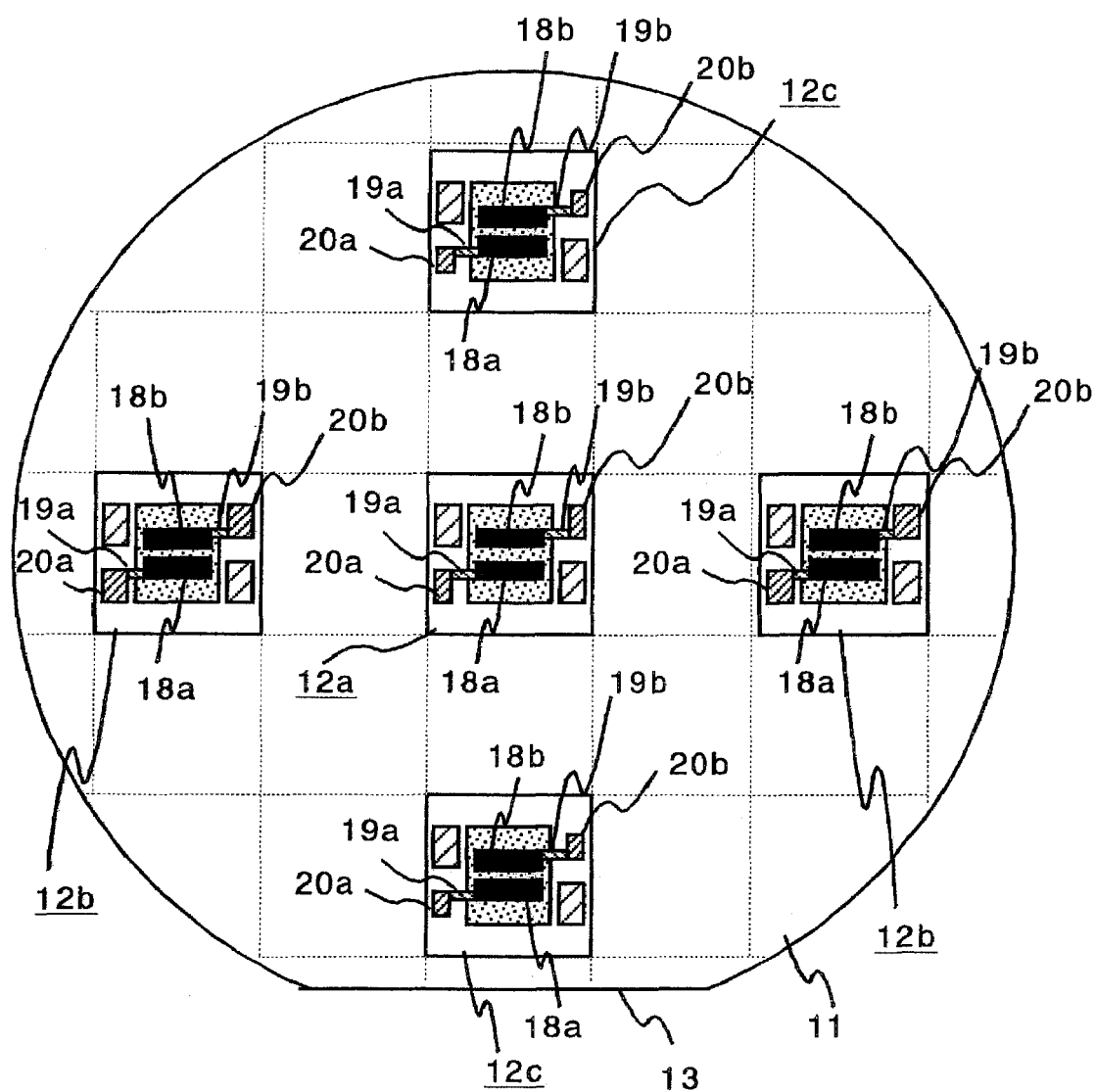
FIG. 1 illustrates the film acoustic wave devices for embodiment 1 of the invention.

FIG. 1 illustrates the film acoustic wave devices for embodiment 1.

Figure 2:
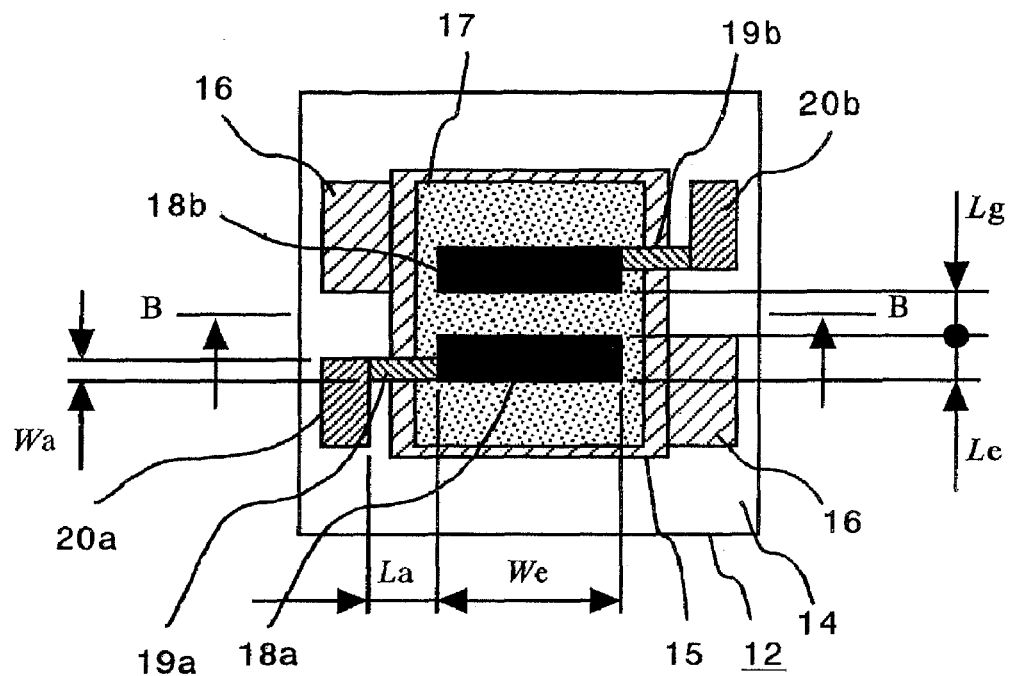
FIG. 2 is an enlarged diagram of the film acoustic wave device of FIG. 1.
Figure 3:
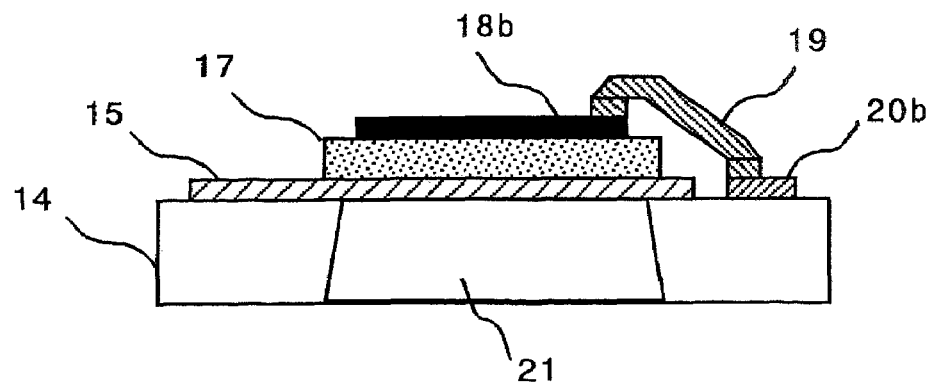
FIG. 3 is a cross-section of the film acoustic wave device of FIG. 2.

FIG. 2 is an enlarged diagram of the film acoustic wave device shown in FIG. 1. FIG. 3 is a cross-section B—B of FIG. 2.

A description of the numbered components indicated in FIGS. 1–3 follows: a wafer 11 is a semiconductor made of gallium arsenide (GaAs); film acoustic wave devices 12a~12c formed on top of the wafer 11; an orientation flat 13 showing the standard surface of the wafer 11; a semiconductor substrate 14 made of gallium arsenide (GaAs); a ground electrode 15; bonding pads 16 having the same electric potential as the ground electrode 15; a piezoelectric thin film 17 made of lead titanate ($PbTiO_3$); upper electrodes 18a and 18b; connecting patterns 19a and 19b; bonding pads 20a and 20b respectively connected to the upper electrodes 18a and 18b; and a via hole 21.

A film acoustic wave device 12 shown in FIG. 2 is a filter made of a single upper electrode of input side 18a and a single upper electrode of output side 18b. This filter uses bulk waves, unlike the surface acoustic wave filter. That is, the filter uses the resonance of the thickness direction and resonance between the upper electrode of input side 18a and upper electrode of output side 18b, using a fewer number of electrodes than the surface acoustic wave filters. The filter has the following pattern dimensions: length upper electrodes 18a and 18b is Le; width is We; and distance between the upper electrode of input side 18a and upper electrode of output side 18b is La. Length of connecting patterns 19a and 19b is Lg and width is Wa. The FIG. 3 shows the use of an air bridge to connect patterns 19a and 19b to the upper electrodes 18a and 18b.

The measurements of each pattern Le, We, Lg, La and Wa determines the frequency response of the film acoustic wave device 12 as well as the thickness h of piezoelectric thin film 17.

Normally, when manufacturing this type of film acoustic wave device 12, as FIG. 1 is showing, a plurality of film acoustic wave devices 12a~12c are arranged on top of a single wafer 11. In reality, 100 or more film acoustic wave devices are arranged, however, for the purpose of simplicity, FIG. 1 has been limited to displaying served. Since several film acoustic wave devices 12a~12c are arranged on top of the single wafer 11, many film acoustic wave devices 12 can be manufactured at once by processing a single wafer 11. A cost of processing a single wafer 11 is not a question of the number of film acoustic wave devices 12, but the cost is determined by the number of wafer processing. The greater the number of film acoustic wave devices 12 obtained from the single wafer, the lower the cost of manufacturing per film acoustic wave device 12. In addition, more than one wafer can be processed at one wafer processing which will further reduce the manufacturing cost.

Figure 44:
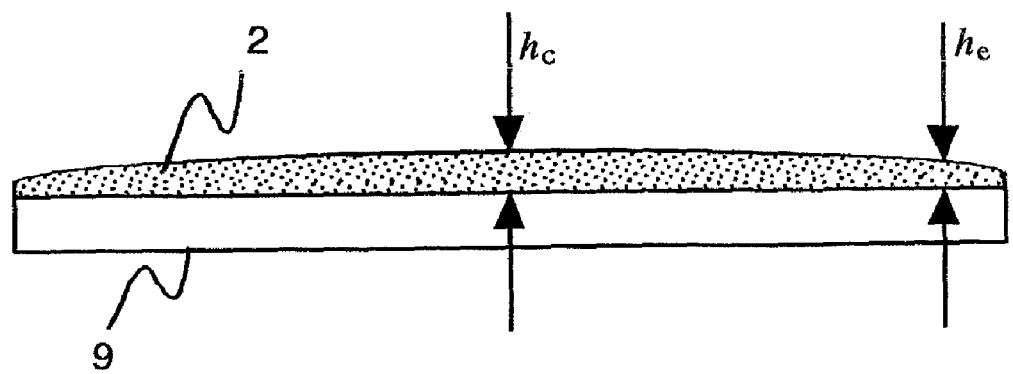
FIG. 44 illustrates an example of thickness distribution of the piezoelectric thin film on top of the wafer.

In this type of film acoustic wave device, the vacuum evaporation or the sputtering are commonly used in forming the films on ground electrode 15, the piezoelectric thin film and upper electrodes 18a and 18b. The lower electrode 15, the piezoelectric thin film 17 and the upper electrodes 18a and 18b are formed inside a surface of the wafer 11, and all tend to have a slight variation in thickness distribution. What is meant by the thickness distribution here is a structural change in film component. For example, when sputtering the piezoelectric thin film 17 onto a single wafer, as FIG. 44 shows, a central portion of the wafer becomes thick and a periphery of the wafer becomes thin. The thickness distribution is also affected by a condition of the wafer at the sputtering. For instance, when rotating the wafer inside a sputtering apparatus, this may result in the thickness distribution in a form of band at a central portion of the wafer. A variation in the thickness of piezoelectric thin film 17 is a change in frequency upon manufacturing the film acoustic wave device 12.

Due to this, when arrange a plurality of the film acoustic wave devices with the same pattern measurements Le, We, Lg, La and Wa on a single wafer 11, for example, at a central part of the wafer 11 where the piezoelectric thin film 17 is thick, a frequency of the film acoustic wave device 12a decreases at the central part of wafer 11, and at a periphery of the wafer 11 where the piezoelectric thin film 19 becomes thinner compared to the central part of the wafer, the frequency of film acoustic wave device 12b is increases. In the film acoustic wave devices of this invention, by changing at least more than one of the pattern measurements Le, We, Lg, La and Wa, the frequency at the central part and the periphery of the wafer for the film acoustic wave devices are adjusted. In FIG. 1, at least more than one of the pattern measurements Le, We, Lg, La and Wa are changed for the film acoustic wave device 12c in a direction perpendicular to the orientation flat 13, the film acoustic wave device 12b in a direction parallel to the orientation flat 13. A concrete description on the methods of changing the pattern measurements will follow in the embodiments.

A description on the equivalent circuit used in the following embodiments are given below.

Figure 4:
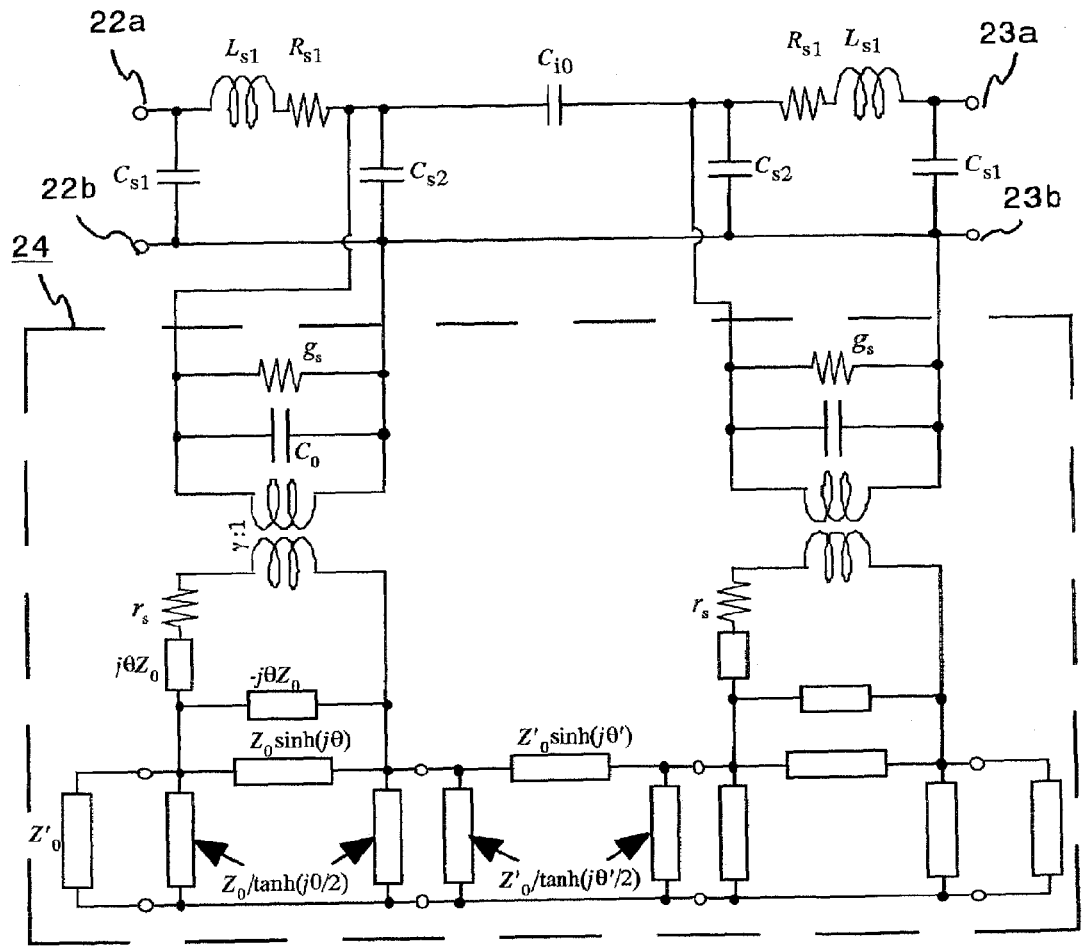
FIG. 4 illustrates an equivalent circuit of the film acoustic wave device of FIG. 2.
Figure 5:
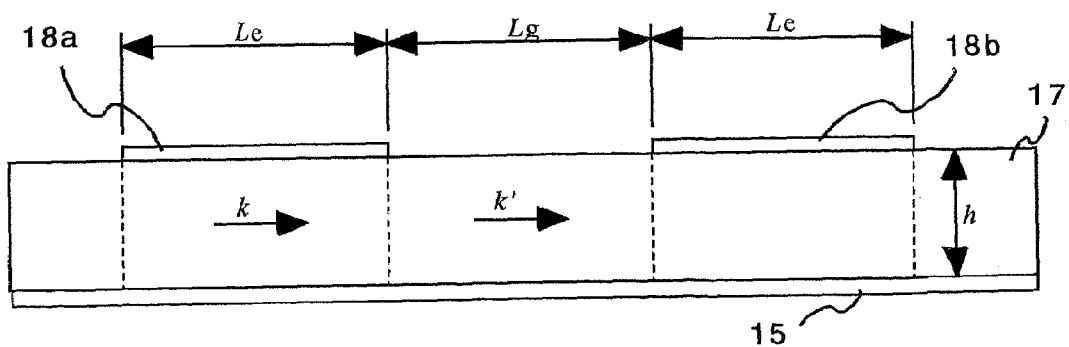
FIG. 5 is the cross-section of upper electrode area for the film acoustic wave device of FIG. 2.
Figure 6:
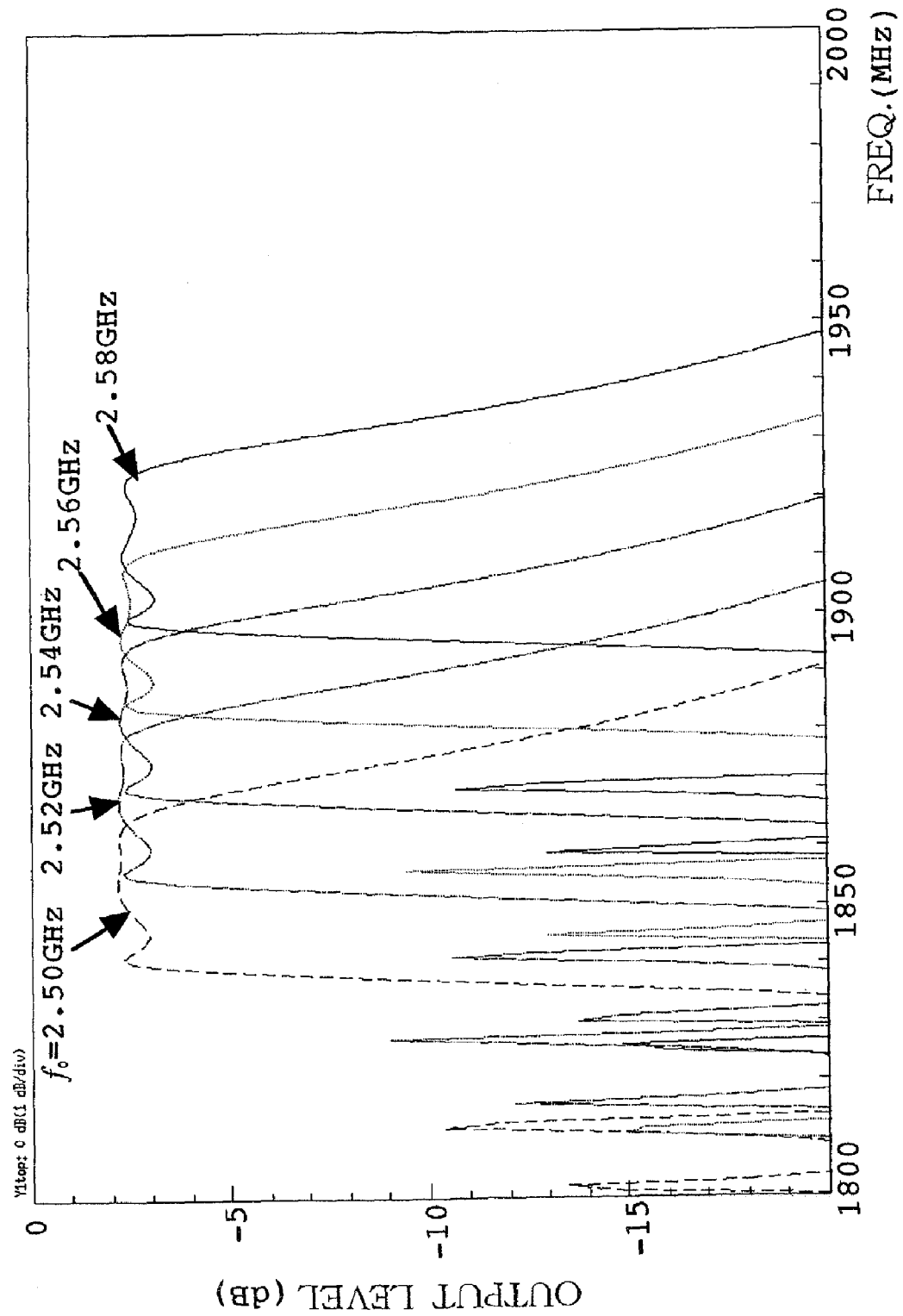
FIG. 6 is a graph showing calculated results of frequency response upon changing the resonating frequency of film acoustic wave device.

FIGS. 4 to 6 are diagrams describing calculations of the frequency responses.

FIG. 4 shows the equivalent circuit of the film acoustic wave device 12 of FIG. 2.

FIG. 5 is a cross-section for regions of the upper electrode of input side 18a and the upper electrode of output side 18b for the film acoustic wave device 12.

In FIG. 4, a part enclosed in square with dashed line is the equivalent circuit 24 for a bulk acoustic wave filter. The equivalent circuit 24 is connected to the part corresponding to the section from the upper electrode of input side 18a to the upper electrode of output side 18b. The equivalent circuit 24 of the bulk acoustic wave filter is corresponding to a path of signal from the upper electrode of input side 18a to the upper electrode of output side 18b, as shown in FIG. 5. When all of the pattern measurements Le, We, Lg, La and Wa are changed, element values of the equivalent circuit 24 for the bulk acoustic wave filter are changed. Upper capacitors $C_{s1}$, $C_{s2}$, and $C_{i0}$, an inductor $L_{s1}$, and a resistor $R_{s1}$ for the equivalent circuit 24 of bulk acoustic wave filter are stray components such as stray capacitance, stray inductance and resistance of the connecting patterns 19a and 19b and the bonding pads 20a and 20b for the film acoustic wave device 12. The capacitor $C_{s1}$ represents a capacitance of the bonding pads 20a and 20b and a capacitive reactance of the connecting patterns 19a and 19b. The capacitor $C_{s2}$ represents a capacitance of upper electrodes 18a and 18b (except for the piezoelectric thin film 17) and the capacitive reactance of the connecting patterns 19a and 19b. The capacitor $C_{i0}$ represents a capacitance between the upper electrode of input side 18a and the upper electrode of output side 18b. The inductor $L_{s1}$ represents an inductive reactance of the connecting patterns 19a and 19b. The resistor $R_{s1}$ represents a resistance such as a conductor resistance of the electrodes 18a and 18b, the connecting patterns 19a and 19b, and the bonding pads 20a and 20b. For a detailed description of the equivalent circuit 24 of bulk acoustic wave filter, refer to the following journals: "Journal of Electronics, Information and Communication Engineers of Japan, '76/11, Vol. J59-A, No. 11, pp. 985–992, 1976" (hereinafter document 6), "Journal of Electronics, Information and Communication Engineers of Japan, '79/1, Vol. J62-A, No. 1, pp. 8–15. 1979" (hereinafter document 7), and "Journal of Electronics, Information and Communication Engineers of Japan, '80/6, Vol. J63-A, No. 6, pp. 327–334, 1980" (hereinafter document 8).

FIG. 6 is a graph showing the frequency response of the film acoustic wave device 12 calculated using the equivalent circuit of FIG. 4.

The graph shows the following frequency response: a dashed line represents a resonant frequency $f_o$ of 2.5 GHz; a double dotted line represents the resonant frequency $f_o$ of 2.52 GHz; a single dotted line represents the resonant frequency $f_o$ of 2.54 GHz; a dotted chained line represents the resonant frequency $f_o$ of 2.56 GHz; and a plain line represents the resonant frequency $f_o$ of 2.58 GHz. A density of the piezoelectric thin film is 7700 kg/m³, a relative dielectric constant is 200, a parallel resonance of Q which determines a resistor $r_s$ is 500, a series resonance of Q which determines a conductance $g_s$ is 500, a normalized length of electrode (Le/h) is 10, a normalized distance between electrodes (Lg/h) is 0.6, a normalized width of electrode (We/h) is 111, the thickness is approximately 0.9 μm, $C_{s1}$ is 0.8 pF, $C_{s2}$ is 0.2 pF, $C_{i0}$ is 0.02 pF, $L_{s1}$ is 8 nH, and $R_{s1}$ is 6 Ω. An effective piezoelectric constant of electrode is 4.0 C/m, a propagation loss of acoustic wave along to a surface of the electrode is 3 dB/100 μm, a normalized cutoff frequency ($f_m/f_o$) is 0.734, a constant which determines a gradient of dispersion property is −14.9754, an effective piezoelectric constant of the non-electrode part is 0.2 C/m, a propagation loss of acoustic wave along to a surface of the electrode is 3 dB/100 μm, the normalized cutoff frequency ($f_n/f_o$) is 0.802, the constant which determines gradient of dispersion property is −17.5854. The values are obtained from the piezoelectric thin film 17 made of lead titanate ($PbTiO_3$) and the ground electrode 15 and the upper electrodes 18a and 18b made of platinum (Pt). The resonant frequency $f_o$ represents a thickness-extensional wave provided that both sides of the piezoelectric thin film 17 are free surfaces, and provided that the acoustic velocity of the thickness-extensional wave is Vs, the following expression is established for the resonant frequency $f_o$:

$$f_o = Vs/(2h)$$

That is, if the piezoelectric thin film 17 on top of the wafer 11 is uniform in material quality, and if the acoustic velocity Vs for the thickness-extensional wave is fixed, the resonant frequency $f_o$ of the thickness-extensional wave is inversely proportional to the thickness h of the piezoelectric thin film 17. Therefore, as in FIG. 6, when the resonant frequency $f_o$ changes from 2.5 GHz to 2.58 GHz, the thickness h of the piezoelectric thin film 17, as opposed to the thicker type of thickness $h_c$ corresponding to resonant frequency $f_o$=2.5 GHz, the thinner type of thickness $h_e$ corresponding to resonant frequency $f_o$=2.58 GHz is 2.5/2.58= 0.969 times the thicker type.

From the example in FIG. 6, responding to the change in the resonant frequency $f_o$, a change in the frequency response for the film acoustic wave device 12 is observed at a frequency axis. That is, the change in the thickness h of piezoelectric thin film 17 itself becomes a lag in frequency of a passband for the film acoustic wave device 12.

The following embodiments take this presumption and are using the equivalent circuit of FIG. 4.

Embodiment 2

Figure 7:
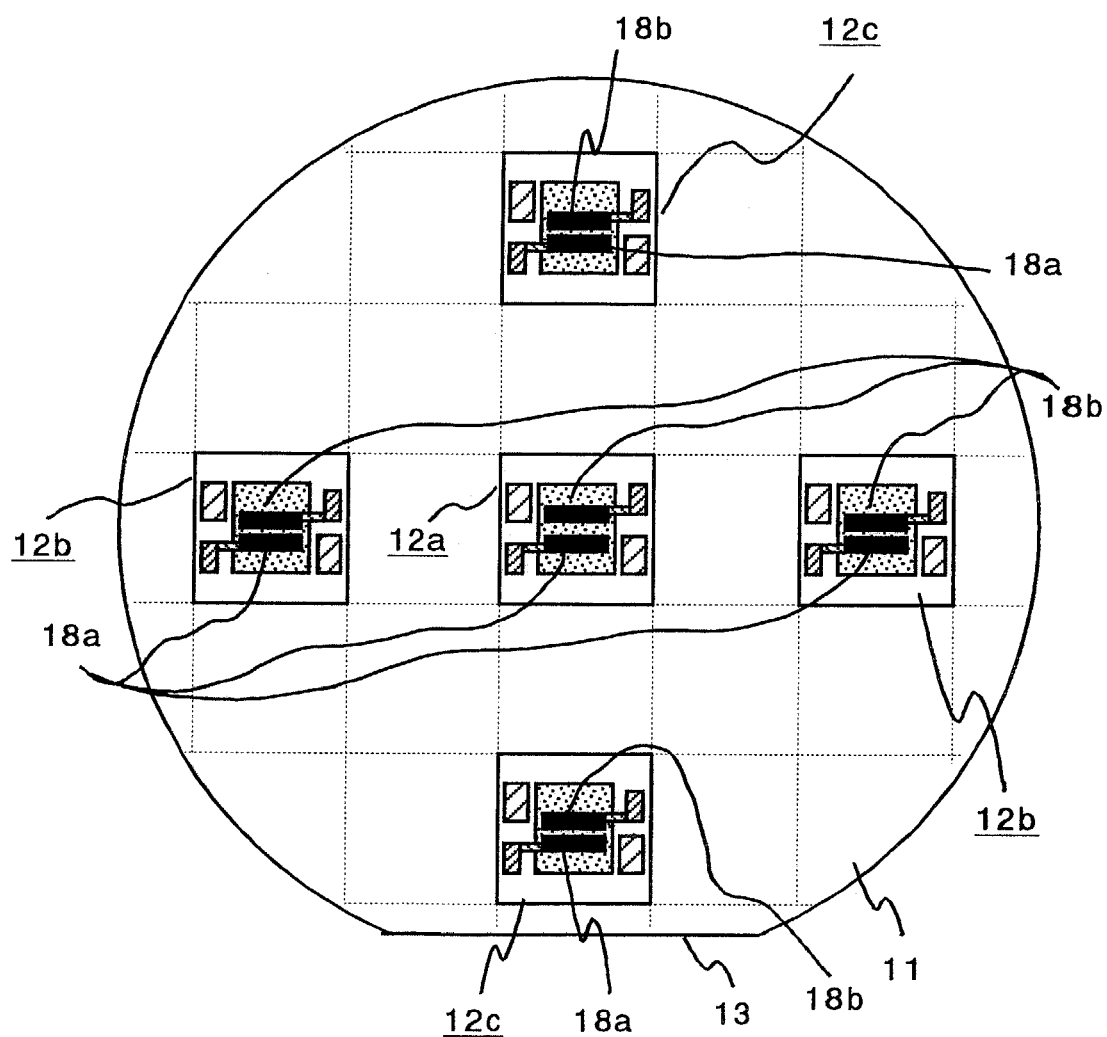
FIG. 7 illustrates the film acoustic wave devices for embodiment 2.

FIG. 7 illustrates the film acoustic wave device for embodiment 2.

A description of the numbered components indicated in FIG. 7 follows: the wafer 11, the film acoustic wave device 12a in a central part of the wafer; the film acoustic wave device 12b in a peripheral part of the wafer that parallels in the direction of orientation flat 13; the film acoustic wave device 12c in the peripheral part of the wafer that is perpendicular to the direction of orientation flat 13; and the upper electrode of input side 18a and the upper electrode of output side 18b.

In FIG. 7 of the present embodiment, the distances Lg between the upper electrodes of input side 18a and output side 18b are changed for the film acoustic wave device 12a at the central wafer and the film acoustic wave devices 12b and 12c at the peripheral wafer.

Figure 8:
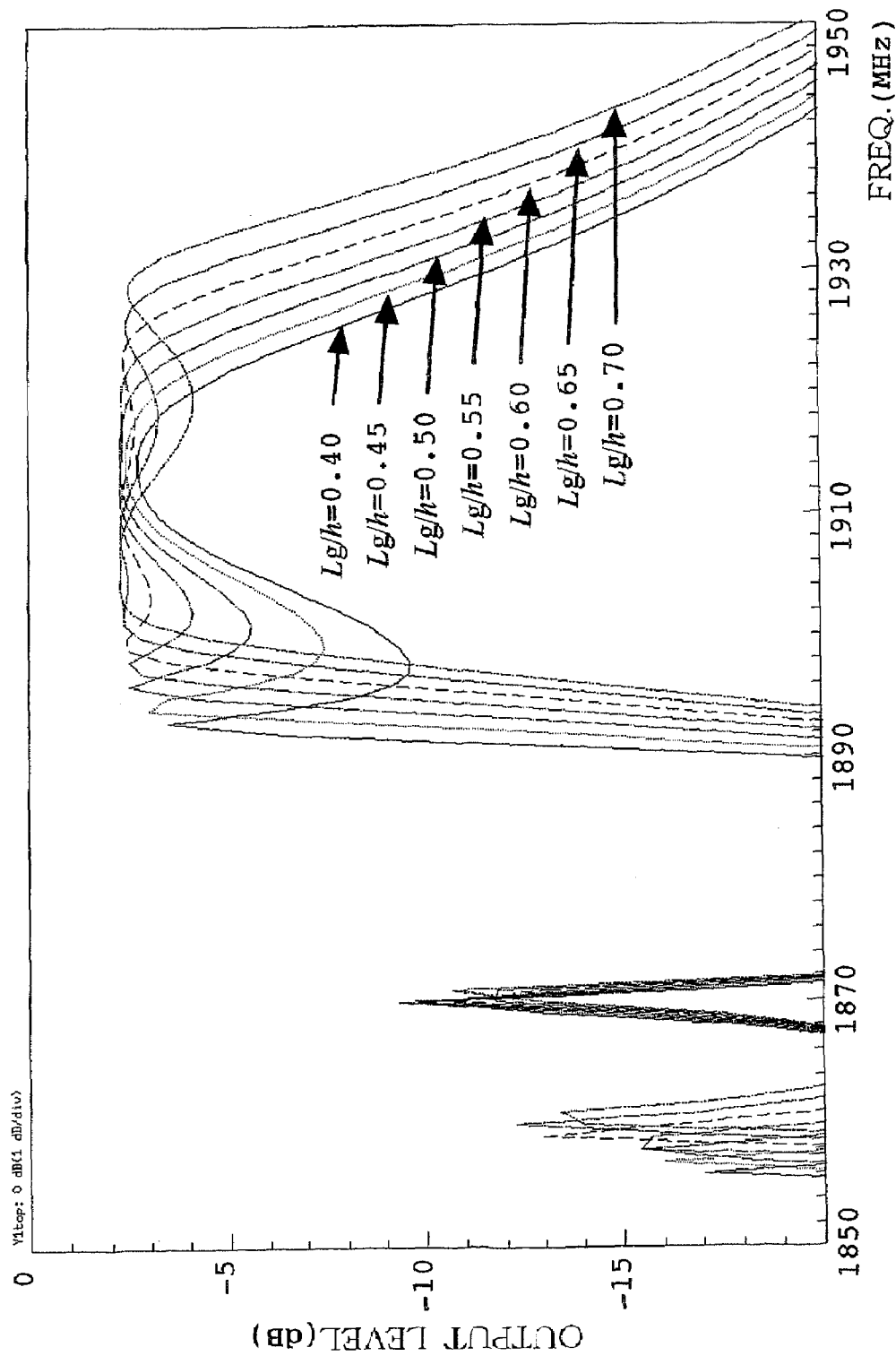
FIG. 8 is the graph showing the calculated results of frequency response of the film acoustic wave device for embodiment 2.

FIG. 8 shows the calculated results of frequency response when the distances Lg between the electrodes are changed.

As described previously in FIG. 6, the frequency response are calculated using the equivalent circuit of FIG. 4. In FIG. 8, the frequency response are calculated by changing the normalized distance between the electrodes (Lg/h) from 0.4 to 0.7. The normalized length of electrode (Le/h) is 10, and the normalized width of electrode (We/h) is 111, and all other calculation parameters are same as in FIG. 6.

As apparent from FIG. 8, when increase the normalized distance between the electrodes (Lg/h) the passband shifts to a higher region of frequency. When the normalized distance between the electrodes (Lg/h) is increased by 0.05, the passband shifts to the high frequency side by 2 MHz. But, when the normalized distance between the electrodes (Lg/h) declines, a loss fluctuation inside a band is large, meaning there is in fact a limit to the normalized distance between electrodes that can be applied for an adjustment of the passband. Such limitation depends on a type of piezoelectric thin film 17 being used, thickness h of the piezoelectric thin film, a type, thickness, and measurements of electrodes and stray components such as the element value of the circuit shown in FIG. 4. That is, in the calculation example of FIG. 8 shows the normalized distances between the electrodes (Lg/h) are from 0.4 to 0.7, however, if the type of piezoelectric thin film 17, the thickness of piezoelectric thin film 17, the type of electrode, the thickness, the measurements and the stray components such as the element value of equivalent circuit are different from FIG. 8, then an appropriate range for the normalized distance between the electrodes (Lg/h) will be different from the case shown in FIG. 8.

Embodiment 3

Figure 9:
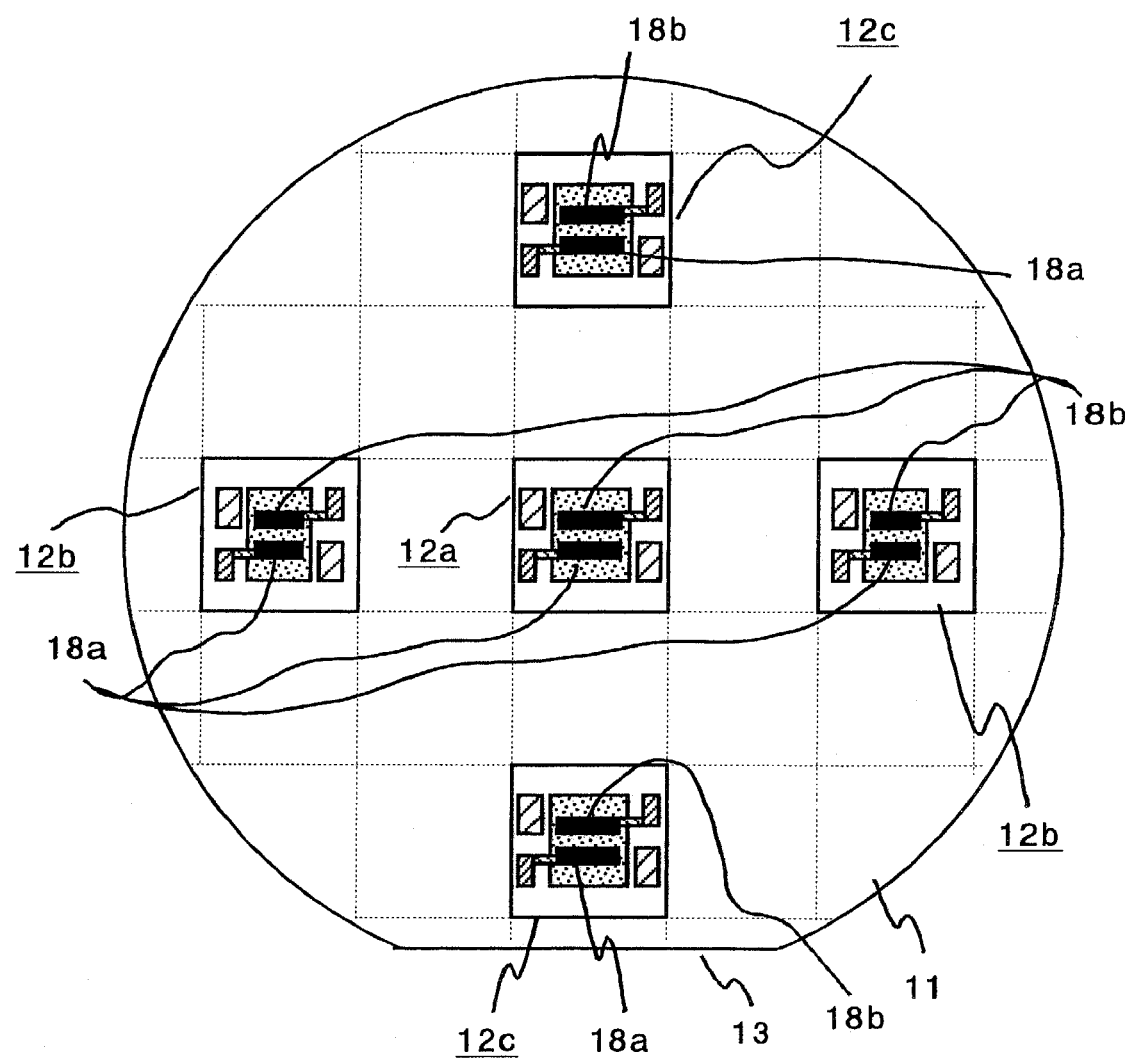
FIG. 9 illustrates the film acoustic wave devices for embodiment 3.

FIG. 9 illustrates the film acoustic wave device for embodiment 3.

A description of the numbered components indicated in FIG. 9 follows: the wafer 11, the film acoustic wave device 12a in a central part of the wafer; the film acoustic wave device 12b in the peripheral part of the wafer that parallels in the direction of orientation flat 13; the film acoustic wave device 12c in the peripheral part of the wafer that is perpendicular to the direction of orientation flat 13; and the upper electrode of input side 18a and the upper electrode of output side 18b.

In FIG. 9 of the present embodiment, width We of the upper electrodes 18a and 18b are changed for the film acoustic wave device 12a of the central wafer 11 and the film acoustic wave devices 12b and 12c of the peripheral wafer 11.

Figure 10:
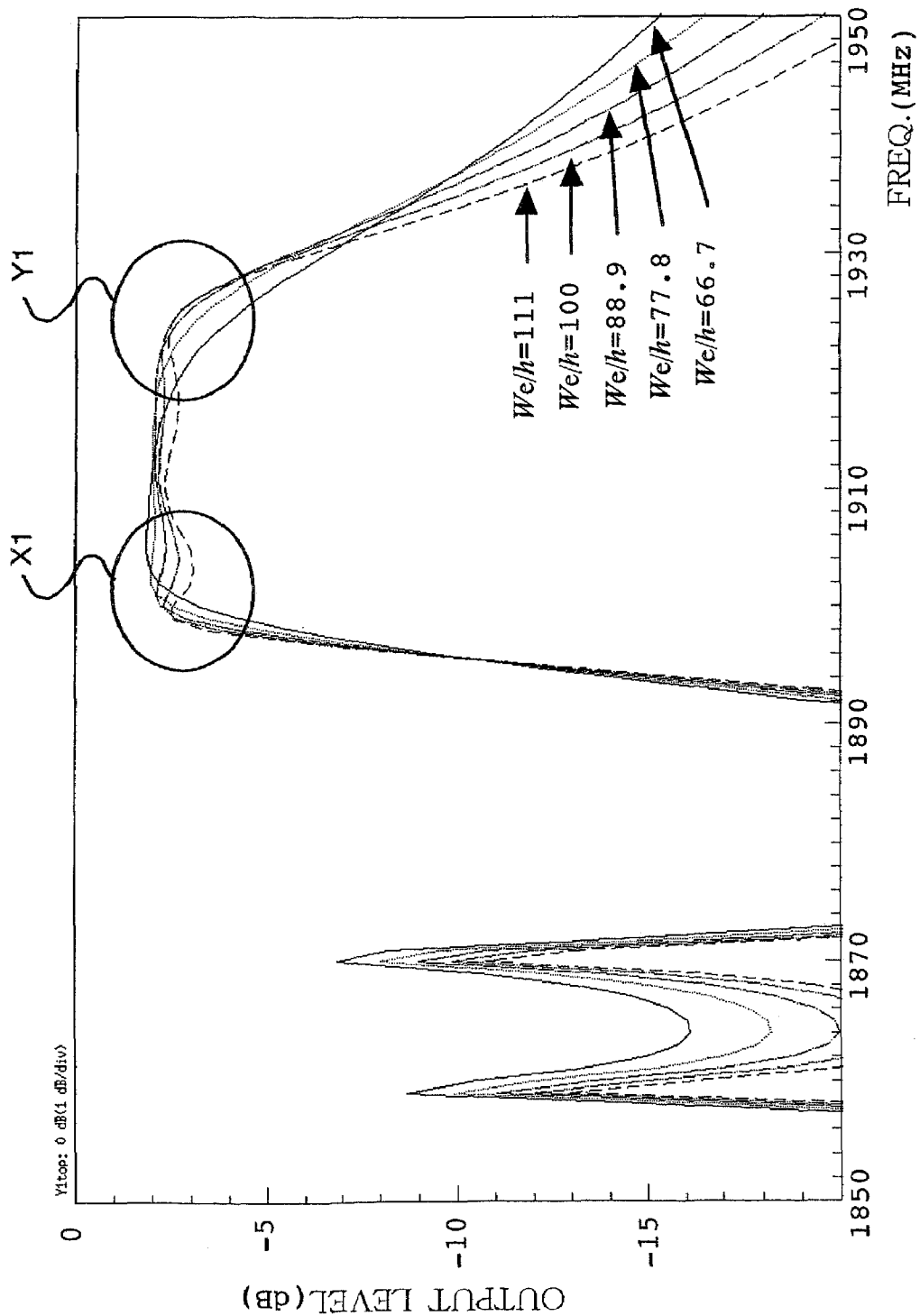
FIG. 10 is the graph showing the calculated results of frequency response of the film acoustic wave device for embodiment 3.

FIG. 10 shows the calculated results of the frequency response when the normalized width of electrodes (We/h) are changed.

The frequency response are calculated by changing the normalized width of electrodes (We/h) from 111 to 66.7. The normalized length of electrode (Le/h) is 10, the distance between the normalized electrodes (Lg/h) is 0.6, and all other calculation parameters are same as in FIG. 6.

In the calculation example shown in FIG. 10, when the normalized width (We/h) are changed, and a change at a low frequency side of the passband (X1 in the diagram) is slight whereas in a high frequency side of the passband (Y1 in the diagram) the change is large. The passband is shifting to the higher frequency region when the width of normalized electrode (We/h) are increased. When compare the calculation example of the change in normalized distances between the electrodes (Lg/h) in FIG. 8, with the change in the width of normalized electrodes (We/h) of FIG. 10, within the realms of calculation shown in FIGS. 8 and 10, an amount of change for the passband is larger for the change made in the normalized electrode distance (Lg/h). However, if the calculation example of the normalized electrode distance (Lg/h) in FIG. 8 is changed very slightly by 0.05, the passband shifts approximately by 2 MHz that it opens a possibility of manufacturing error of the normalized distance between electrodes (Lg/h) to cause variation in the passband. Therefore, as a precise adjustment of the passband, a method to change the passband slightly is suitable, similar to the case of changing the width of normalized electrode (We/h) of FIG. 10. When changed the normalized width of electrode (We/h) approximately by 10, an amount of the passband shifting is maximum of approximately 2 MHz. The amount of shifting, compared to the manufacturing error, is sufficiently large that there is no need to concern about the variation of passband caused by the manufacturing error of normalized width electrode (We/h).

Here, what is meant by the low frequency side of the passband is, it is an edge of the passband on a low frequency side that are increased by a required amount from a minimum loss value of the passband. The high frequency side of the passband is another edge of the passband on a high frequency side that are increased by the required amount from the minimum loss value of the passband. The required amount for increase from the minimum loss value is normally 3 dB. In this case, a difference in frequency of the passband on the high frequency side from the low frequency side is called bandwidth 3 dB.

Embodiment 4

Figure 11:
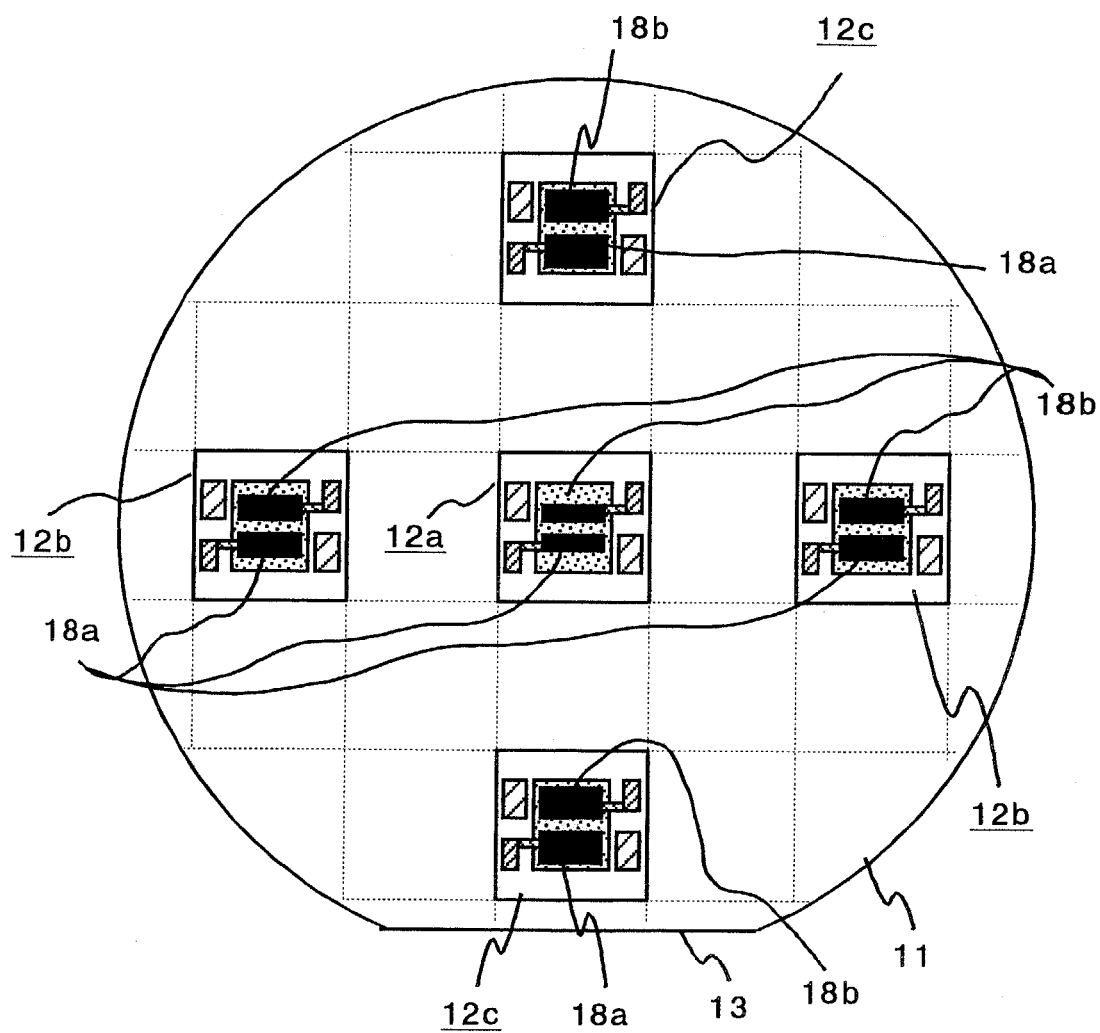
FIG. 11 illustrates the film acoustic wave devices for embodiment 4.

FIG. 11 illustrates the film acoustic wave device for embodiment 4.

A description of the numbered components indicated in FIG. 11 follows: the wafer 11, the film acoustic wave device 12a in a central part of the wafer; the film acoustic wave device 12b in a peripheral part of the wafer that parallels in the direction of orientation flat 13; the film acoustic wave device 12c in the peripheral part of the wafer that is perpendicular to the direction of orientation flat 13; and the upper electrode of input side 18a and the upper electrode of output side 18b.

In FIG. 11 of the present embodiment, the length Le for the upper electrodes 18a and 18b are changed for the film acoustic wave device 12a at the central wafer and the film acoustic wave devices 12b and 12c at the peripheral wafer.

Figure 12:
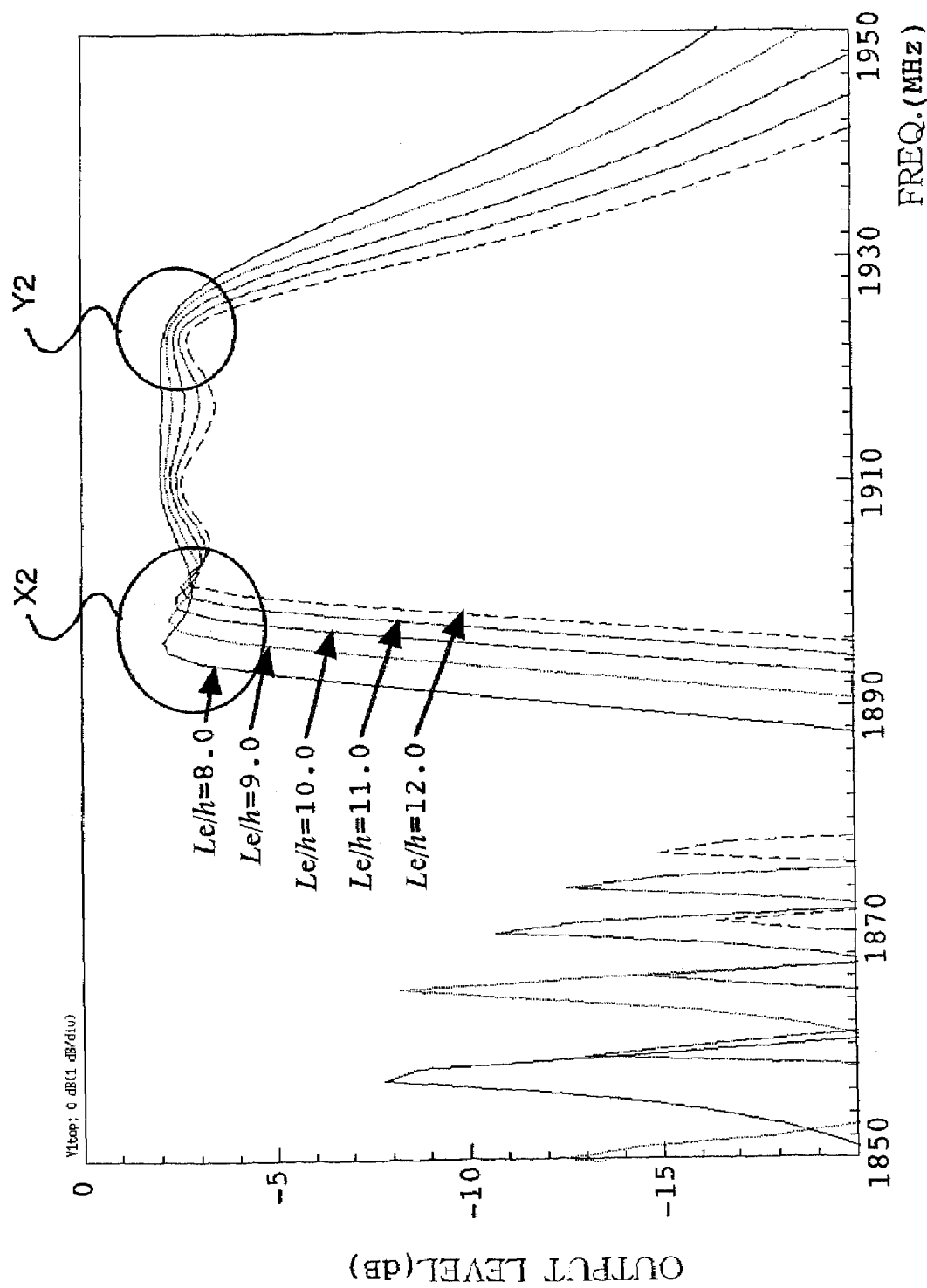
FIG. 12 is the graph showing the calculated results of frequency response of the film acoustic wave device for embodiment 4.

FIG. 12 shows the calculated results of the frequency response when the normalized length of electrodes (Le/h) are changed.

The frequency response are calculated by changing the normalized length of electrodes (Le/h) from 8 to 12. The normalized width of electrodes (We/h) are 111, and the normalized distance between the electrodes (Lg/h) is 0.6, and all other calculation parameters are same as in FIG. 6.

In the calculation example shown in FIG. 12, when increase the normalized length of electrodes (Le/h) the passband tends to narrow down. In the regions of passbands, a change taking place in the passband of low frequency side (X2) is larger than the change taking place in the passband of high frequency side (Y2), and as a result, when increase the normalized length of electrodes (Le/h) the passband will shift to the high frequency side.

Embodiment 5

Figure 13:
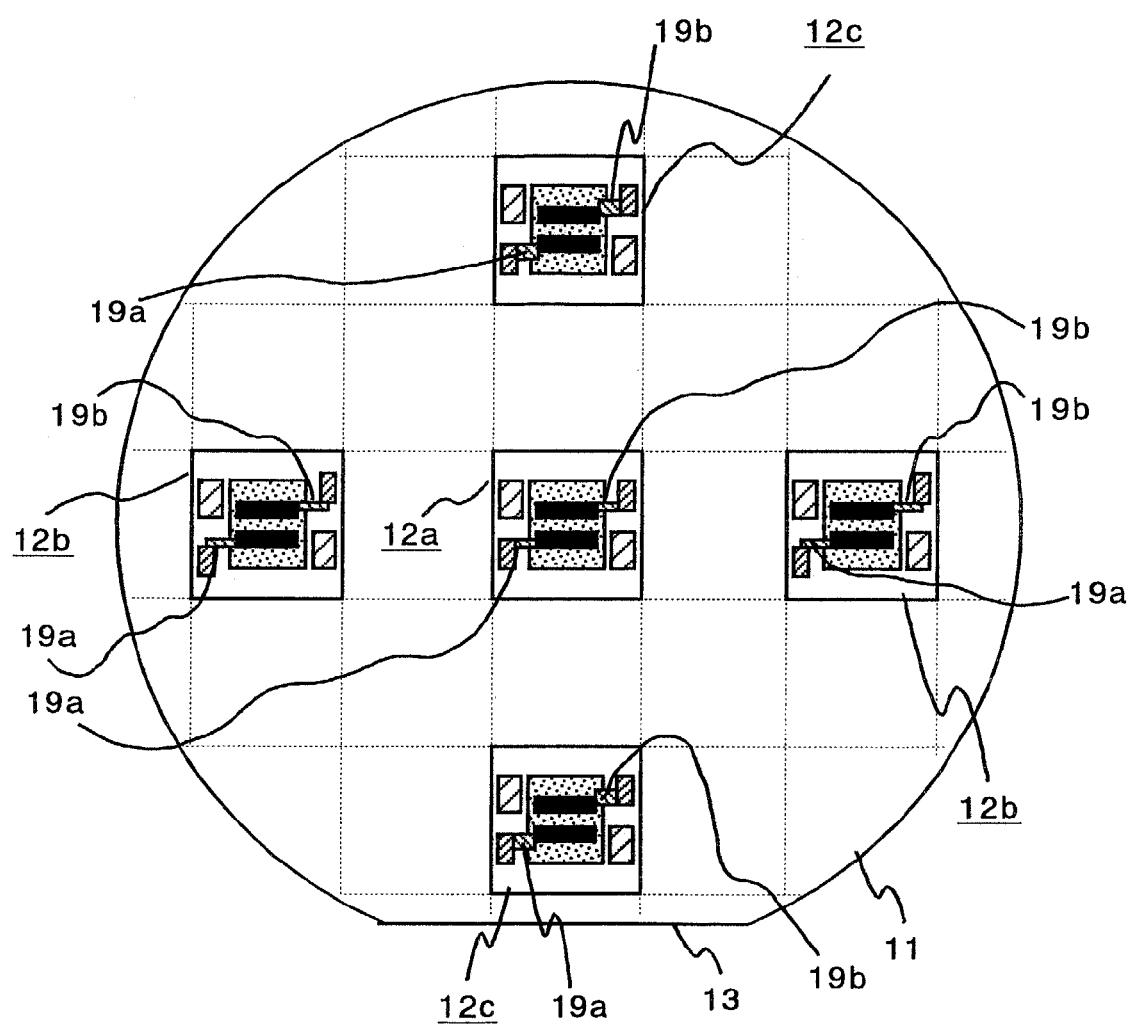
FIG. 13 illustrates the film acoustic wave devices for embodiment 5.

FIG. 13 illustrates the film acoustic wave device for embodiment 5.

A description of the numbered components indicated in FIG. 13 follows: the wafer 11, the film acoustic wave device 12a in a central part of the wafer; the film acoustic wave device 12b in a peripheral part of the wafer that parallels in the direction of orientation flat 13; the film acoustic wave device 12c in the peripheral part of the wafer that is perpendicular to the direction of orientation flat 13; and the connecting patterns 19a and 19b.

In FIG. 13 of the present embodiment, length La of the connecting patterns 19a and 19b are changed for the film acoustic wave device 12a at the central wafer and for the film acoustic wave device 12b at the peripheral wafer. Width Wa of the connecting patterns 19a and 19b are also changed for the film acoustic wave device 12a at the central wafer and the film acoustic wave device 12c at the peripheral wafer.

Figure 14:
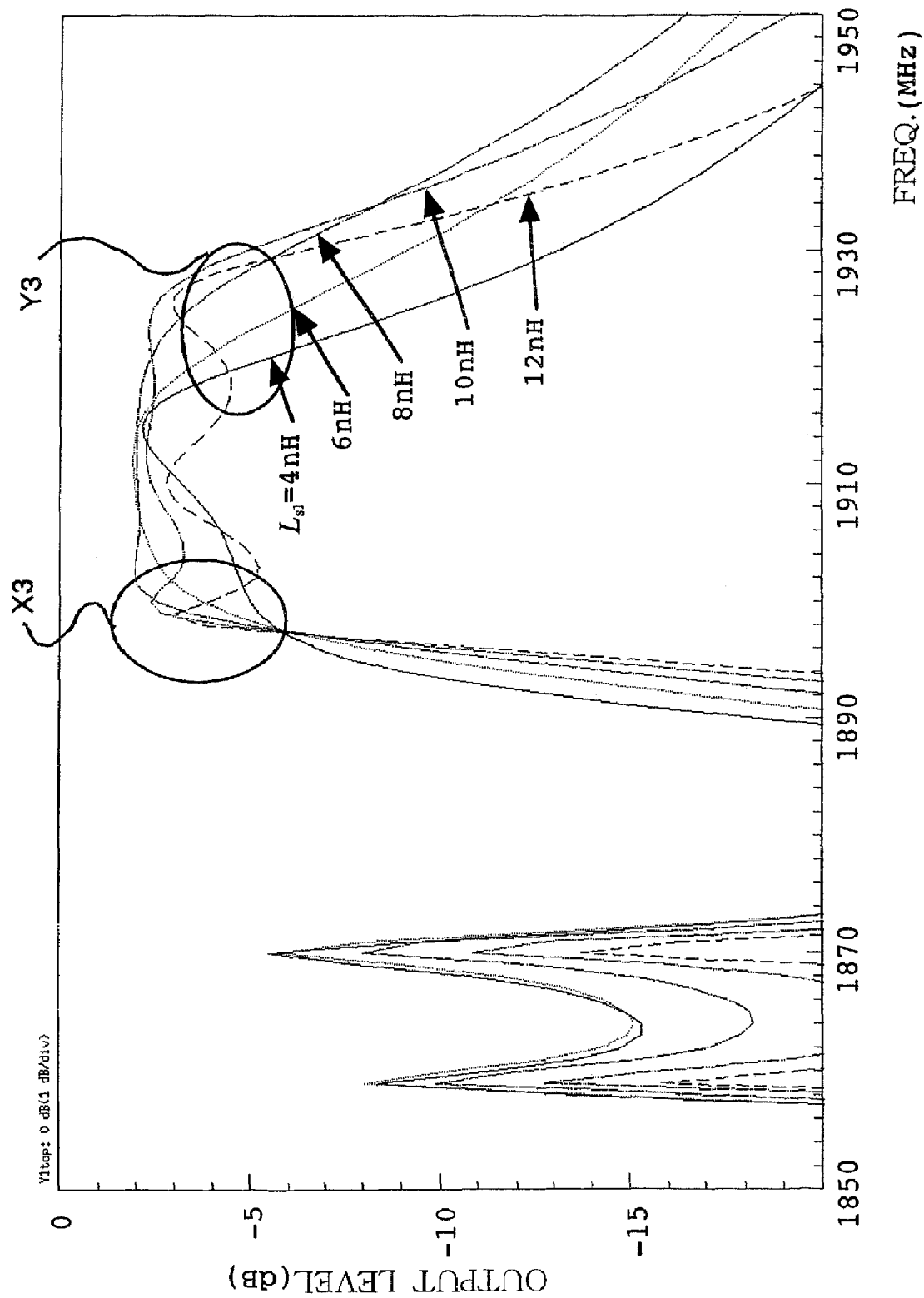
FIG. 14 is the graph showing the calculated results of frequency response of the film acoustic wave device for embodiment 5.

In FIG. 14 shows a result of the frequency response upon changing the inductor $L_{s1}$ shown in FIG. 4.

The inductor $L_{s1}$ is calculated by changing its inductance from 4 nH to 12 nH. The inductance of inductor $L_{s1}$ mainly changes by changing at least one of a length La or a width Wa of connecting patterns 19a and 19b. The normalized width of electrode (We/h) is 77.8, and the normalized length of electrode (Le/h) is 10, and the normalized distance between the electrodes (Lg/h) is 0.6, and all other calculation parameters are same as in FIG. 6.

In the calculation example shown in FIG. 14, when inductance of the inductor $L_{s1}$ increases from 4 nH to 10 nH, the passband of low frequency side (X3) does not almost at all change, and passband of high frequency side (Y3) changes to the higher frequency. This is indicating that when the inductance of inductor $L_{s1}$ gets large, a band width for the passband becomes larger, in addition, the passband changes to the higher frequency side. When the inductor $L_{s1}$ is 12 nH, the higher frequency side of passband is lower than inductor $L_{s1}$ of 10 nH. This is an indication of the appropriateness of the value of inductor $L_{s1}$ below 10 nH in the calculation example of FIG. 14.

FIG. 13 of the present embodiment is showing a case of changing both the length La and the width Wa of connecting patterns 19a and 19b, however, a case can be made to change the length La of connecting patterns 19a and 19b. Alternatively, a case to change only the width Wa of connecting patterns 19a and 19b is also possible. Furthermore, the length La and the width Wa of connecting patterns 19a and 19b can both be changed at the same time.

Embodiment 6

Figure 15:
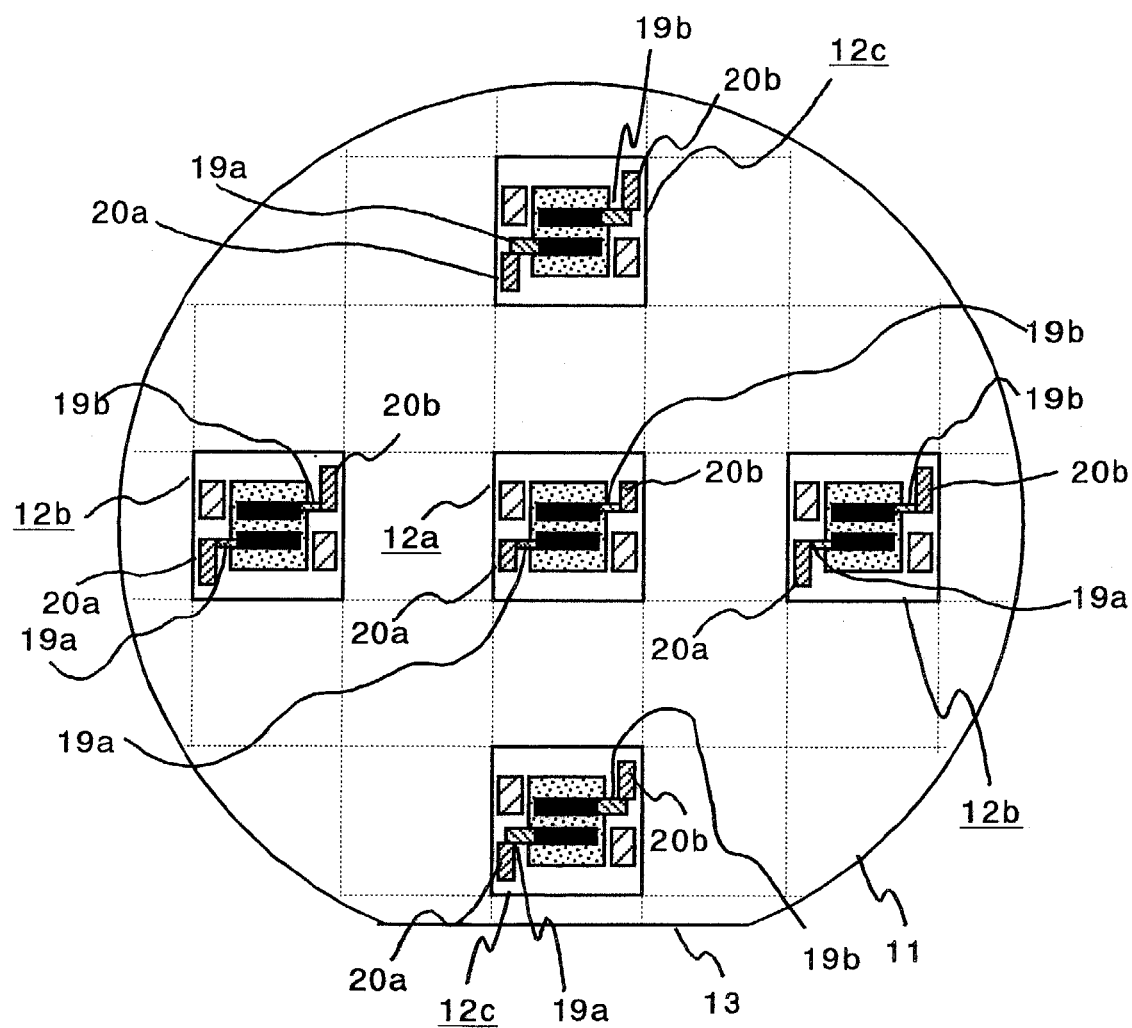
FIG. 15 illustrates the film acoustic wave devices for embodiment 6.

FIG. 15 illustrates the film acoustic wave device for embodiment 6.

A description of the numbered components indicated in FIG. 15 follows: the wafer 11, the film acoustic wave device 12a in a central part of the wafer; the film acoustic wave device 12b in a peripheral part of the wafer that parallels in the direction of orientation flat 13; the film acoustic wave device 12c in the peripheral part of the wafer that is perpendicular to the direction of orientation flat 13; the connecting patterns 19a and 19b; and the bonding pads 20a and 20b.

In FIG. 15 of the present embodiment, for the film acoustic wave device 12a at the central wafer and the film acoustic wave devices 12b and 12c at the peripheral wafer, length La and width Wa for connecting patterns 19a and 19b and areas of bonding pads 20a and 20b are changed. This is equivalent to changing the capacitance of capacitor $C_{s1}$ shown in FIG. 4.

Figure 16:
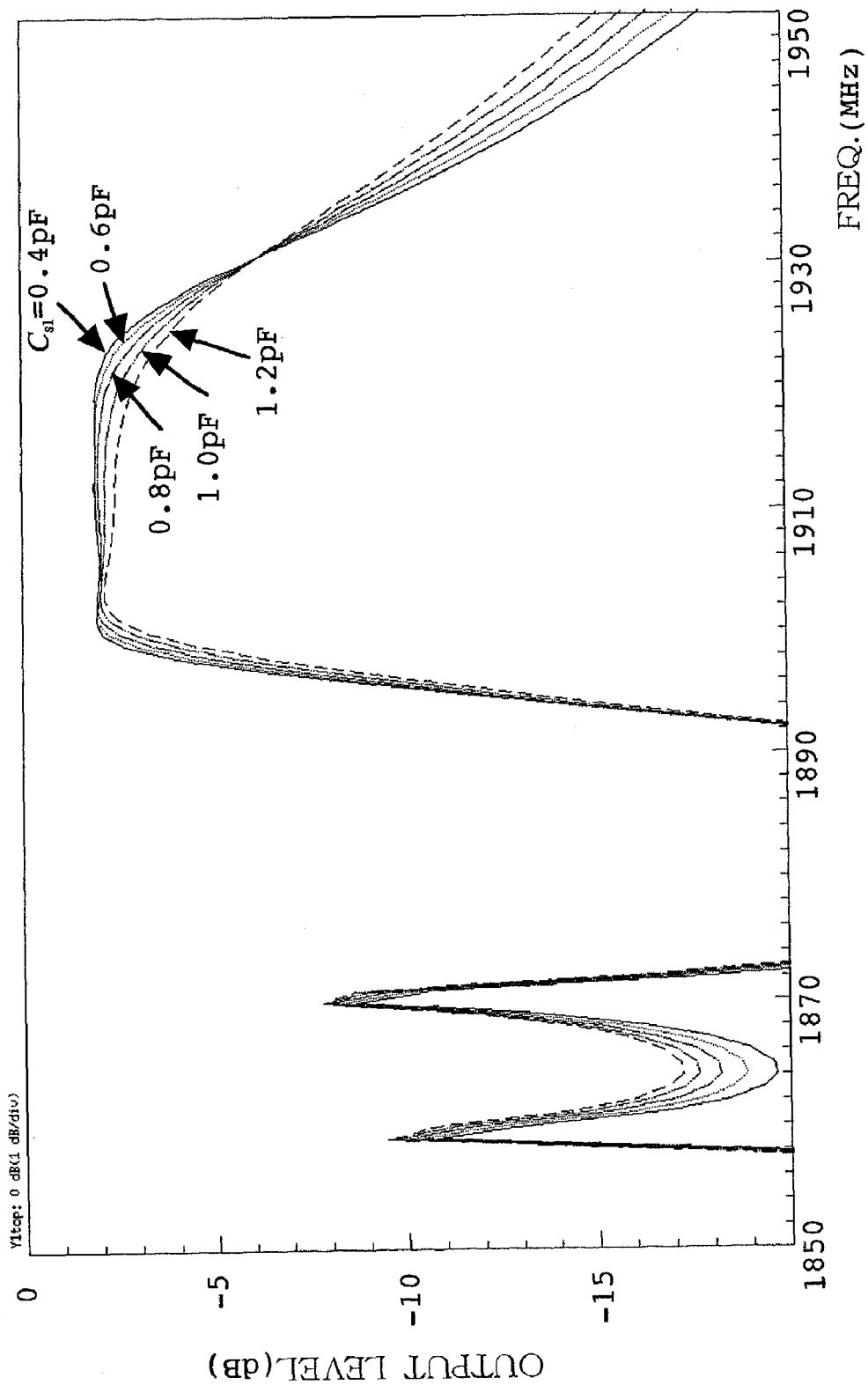
FIG. 16 is the graph showing the calculated results of frequency response of the film acoustic wave device for embodiment 6.

FIG. 16 shows a calculated result of the frequency response when the capacitor $C_{s1}$ shown in FIG. 4 is changed.

The capacitor $C_{s1}$ is calculated by changing its capacitance from 0.4 pF to 1.2 pF. The capacitance of capacitor $C_{s1}$ mainly change by changing the followings: area of bonding pads 20a and 20b; capacitance of the capacitor electrically connected to bonding pads 20a and 20b; and the length La and the width Wa of connecting patterns 19a and 19b. The normalized width of electrode (We/h) is 77.8, the normalized length of electrode (Le/h) is 10, and the normalized distance between the electrodes (Lg/h) is 0.6, and all other calculation parameters are same as in FIG. 6.

In the calculation example of FIG. 16, when the capacitance of capacitor $C_{s1}$ becomes large, low frequency side of passband gradually shift to high frequency side, and the high frequency side of passband will shift to the low frequency side. When this happens, the amount of shifting to the high frequency side is greater than the amount of shifting to the low frequency side, as a result, when the capacitance of capacitor $C_{s1}$ gets large, the band width of passband narrows, at the same time shifts to the low frequency side.

Embodiment 7

Figure 17:
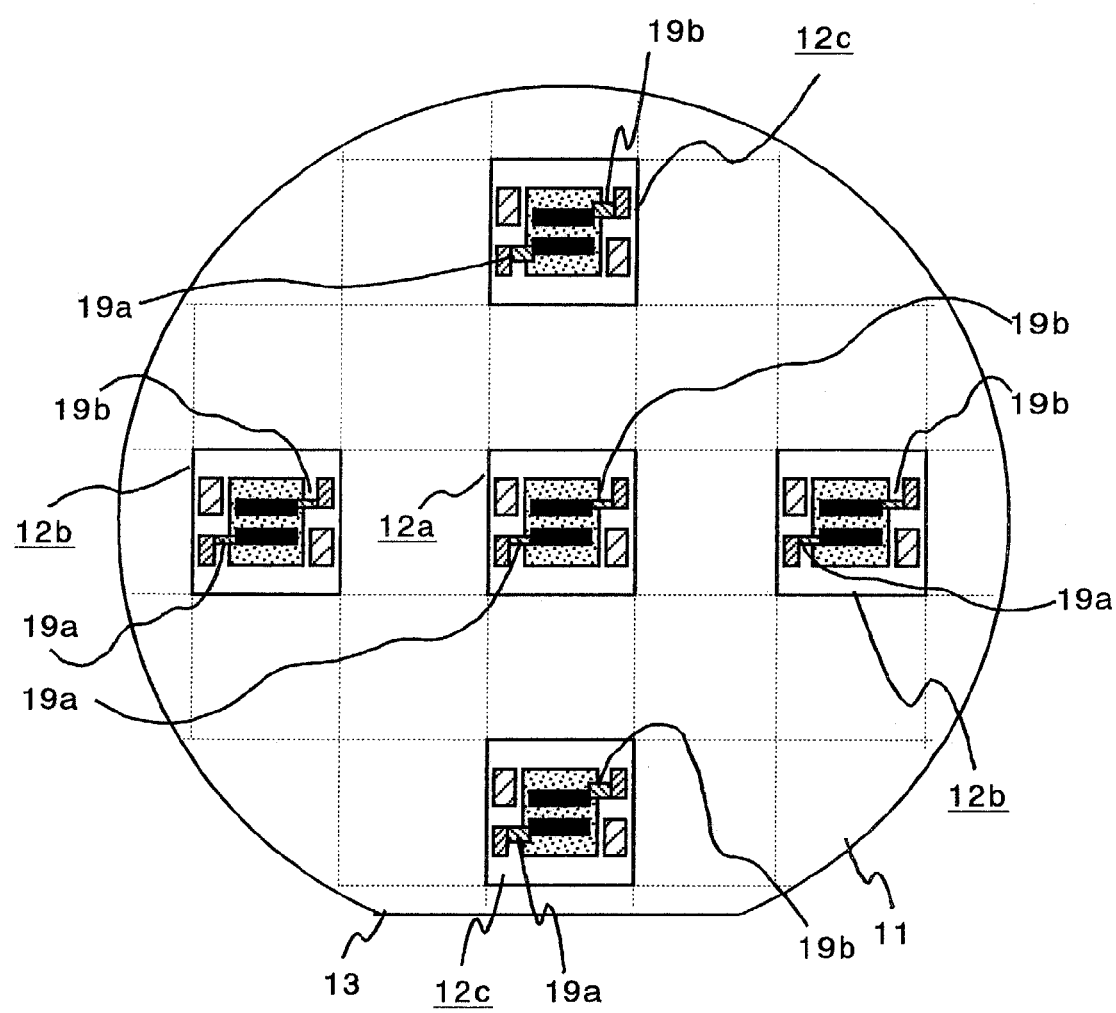
FIG. 17 illustrates the film acoustic wave devices for embodiment 7.

The FIG. 17 illustrates the film acoustic wave device for embodiment 7.

A description of the numbered components indicated in FIG. 17 follows: the wafer 11, the film acoustic wave device 12a in a central part of the wafer; the film acoustic wave device 12b in a peripheral part of the wafer that parallels in the direction of orientation flat 13; the film acoustic wave device 12c in the peripheral part of the wafer that is perpendicular to the direction of orientation flat 13; and the connecting patterns 19a and 19b.

In FIG. 17 of the present embodiment, length La and width Wa of the connecting patterns 19a and 19b are changed for the film acoustic wave device 12a at the central wafer, and the film acoustic wave devices 12b and 12c at the peripheral wafer. This is equivalent to changing the capacitor $C_{s2}$ of FIG. 4.

Figure 18:
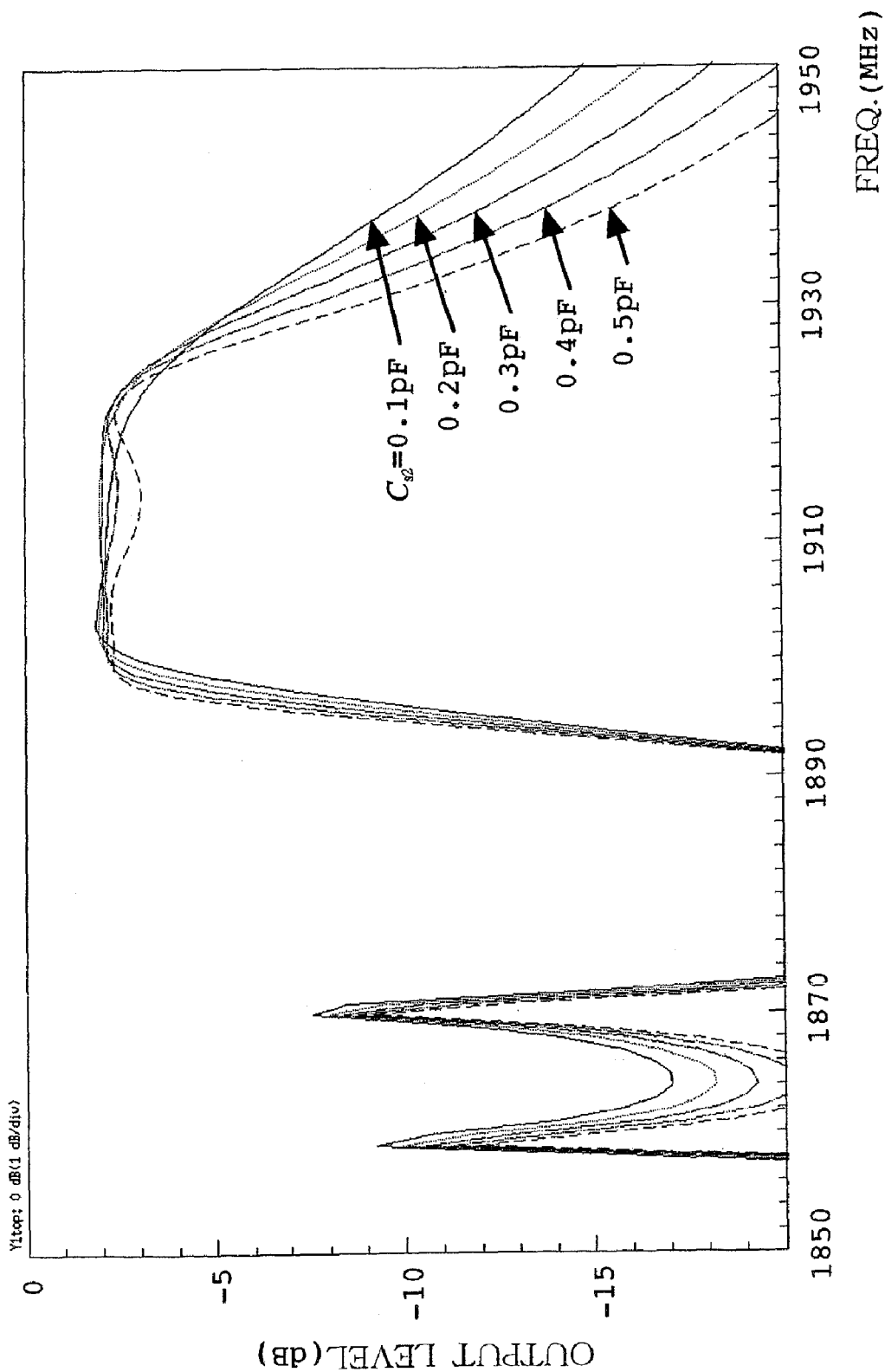
FIG. 18 is the graph showing the calculated results of frequency response of the film acoustic wave device for embodiment 7.

FIG. 18 is a calculated result of the frequency response when the capacitor $C_{s2}$ shown in FIG. 4 is changed.

The capacitor $C_{s2}$ is calculated by changing its capacitance from 0.1 pF to 0.5 pF. The capacitance of capacitor $C_{s2}$ mainly changes by changing the length La or width Wa of connecting patterns 19a and 19b, and by changing the shape and area of upper electrodes 18a and 18b. The normalized width of electrode (We/h) is 77.8, the normalized length of electrode (Le/h) is 10, the normalized distance between the electrodes (Lg/h) is 0.6, and all other calculation parameters are same as in FIG. 6.

In the calculation example shown in FIG. 18, when the capacitance of capacitor $C_{s2}$ increases from 0.2 pF to 0.5 pF, the higher frequency side of passband does not almost at all change and the low frequency side of passband shifts to the low frequency side. When the capacitance of capacitor $C_{s2}$ gets large from 0.2 pF to 0.5 pF, the bandwidth of the passband gets large, as well the passband shifts to the low frequency side. When the capacitance of capacitor $C_{s2}$ is 0.1 pF, compared to the capacitance of capacitor $C_{s2}$ of 0.2 pF, the passband of high frequency side will shift further to the low frequency side. Therefore, in the calculation example of FIG. 18, the capacitance of capacitor $C_{s2}$ greater than 0.2 pF is suitable for use.

As shown in the calculation examples from FIGS. 8 to 18, the passband of the film acoustic wave devices 12 can be controlled by changing the length Le and width We of the upper electrodes 18a and 18b, the distance Lg between the upper electrodes 18a and 18b, the length La and width Wa of the connecting patterns 19a and 19b, the areas of the bonding pads 20a and 20b, and the capacitance of capacitor connected electrically to the bonding pads 20a and 20b. By utilizing these when compensating for the variation of passband for the film acoustic wave device 12 caused from the thickness distribution of the piezoelectric thin film 17 on top of the wafer, able to obtain the film acoustic wave device with constant passband without it being dependent on a wafer positioning. The compensation of variation of passband for the film acoustic wave device 12 due to the thickness distribution of piezoelectric thin film 17 on top of the wafer, for instance, as FIG. 1 shows, is carried out by changing the length Le and width We of the upper electrodes 18a and 18b, the distance Lg between the upper electrodes 18a and 18b, the length La and width Wa of connecting electrodes 19a and 19b, the areas of the bonding pads 20a and 20b, and the capacitance of capacitor connected electrically to the bonding pads 20a and 20b.

Embodiment 8

Figure 19:
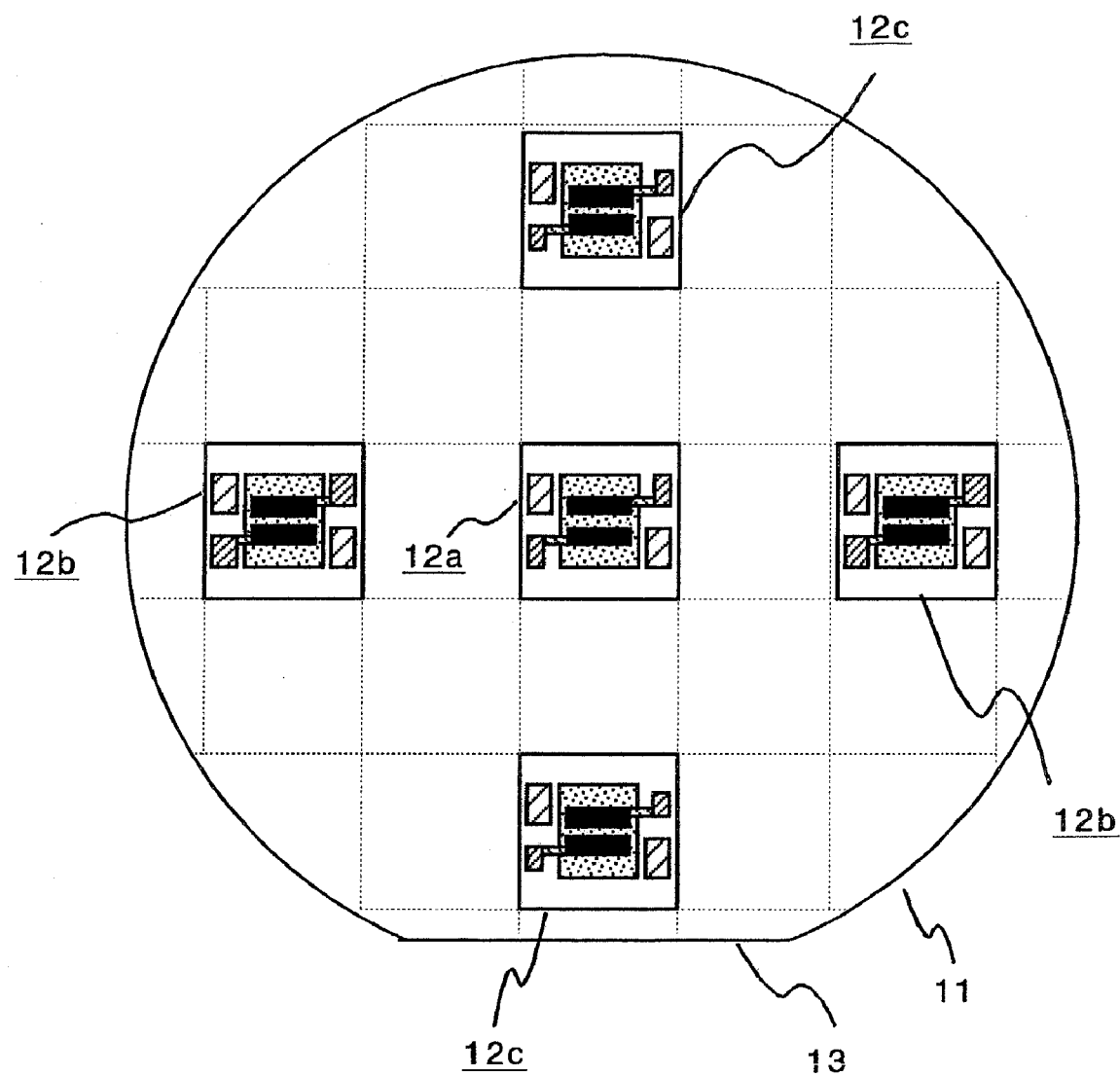
FIG. 19 illustrates the film acoustic wave devices for embodiment 8.
Figure 20:
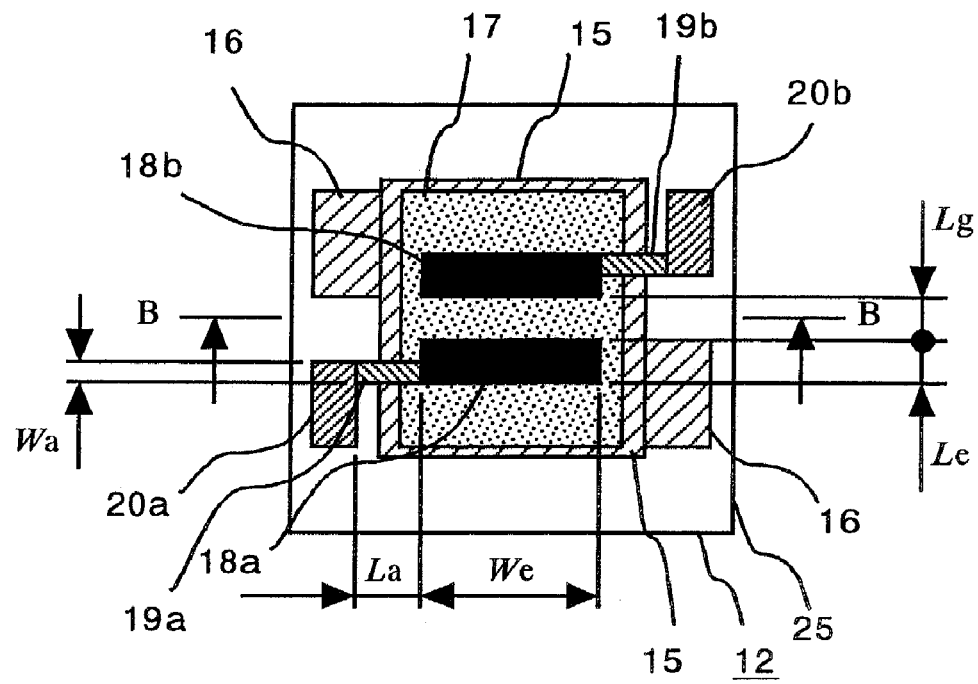
FIG. 20 is the enlarged diagram of the film acoustic wave device of FIG. 19.
Figure 21:
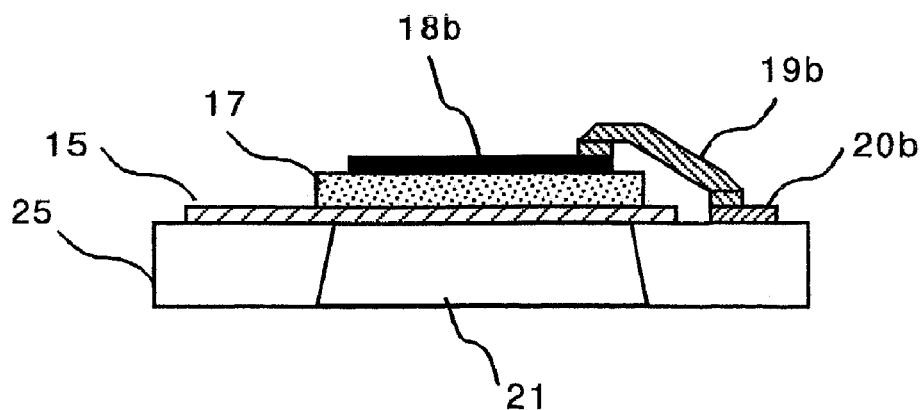
FIG. 21 is the cross-section of the film acoustic wave device of FIG. 20.

FIGS. 19, 20 and 21 illustrate the film acoustic wave device for embodiment 8.

A description of the numbered components indicated in figures follows: the wafer 11 made of silicon (Si) conductor; the film acoustic wave devices 12a~12c; the orientation flat 13 showing the standard surface of wafer 11; a silicon (Si) semiconductor substrate 25; the ground electrode 15; bonding pads 16 at equal electric potential as ground electric potential; the piezoelectric thin film 17 made of lead titanate ($PbTiO_3$); the upper electrodes 18a and 18b; the connecting patterns 19a and 19b; the bonding pads 20a and 20b respectively connected to the upper electrodes 18a and 18b; and the via hole 21.

In FIG. 19, within the variables of length Le, width We of upper electrodes 18a and 18b, and distance Lg between upper electrodes 18a and 18b, length La, width Wa of connecting patterns 19a and 19b, and areas of bonding pads 20a and 20b, more than at least one has changed depending on their positions placed on the wafer 11 for film acoustic wave devices 12a~12c. As FIGS. 8 to 18 are showing, for the film acoustic wave devices 12a~12c, by changing the variables of length Le and width We of upper electrodes 18a and 18b, distance Lg between the upper electrodes 18a and 18b, length La and width Wa of connecting patterns 19a and 19b, the capacitance of capacitor connected electrically to bonding pads 20a and 20b, variation of frequency response from the positioning at the wafer 11 is compensated. From this, even if thickness distribution is formed on top of the piezoelectric thin film 17 from positioning at the wafer 11, the film acoustic wave device 12 with a less variation of frequency response is obtained.

A semiconductor substrate 14 made of gallium arsenide (GaAs) shown in FIG. 1 has a good insulation, and as for a configuration of the film acoustic wave device 12 there is an advantage of minimizing a loss from the semiconductor substrate 14. However, its cost being expensive that it is disadvantaged in terms of manufacturing cost. On the other hand, a semiconductor substrate 25 made of silicon (Si) can be manufactured in massive quantity and expense for the wafer 11 is less. In addition, a radius of the wafer is larger, and when compare a single wafer with the semiconductor substrate 14 made of gallium arsenide (GaAs), the mass production of the film acoustic wave devices 12 is possible, and the manufacturing cost is reduced. Since the area of the wafer 11 is large, a thickness variation of piezoelectric thin film 17 within the wafer 11 becomes large and compensating the variation of frequency response of wafer 11 is important more than the semiconductor substrate 14 made of (GaAs).

FIG. 20 is the enlarged view of the film acoustic wave devices 12a, 12b and 12c of FIG. 19. FIG. 21 is the cross-section B—B of FIG. 20. The film acoustic wave device 12 shown in FIGS. 2 and 3 is using the semiconductor substrate 14, and the film acoustic wave device 12 shown in FIGS. 20 and 21 is using silicon (Si) semiconductor substrate 25. For such cases the materials being used and all of the dimensions will be same except for the semiconductor substrates itself. Also the equivalent circuit 24 of the acoustic wave filter in FIG. 4 is same for both cases, and difference in the element values of capacitors $C_{s1}$, $C_{s2}$ and $C_{i0}$, inductor $L_{s1}$ and resistor $R_{s1}$ arises from the different semiconductor materials being used, which also leads to a difference in the frequency response. Therefore, for the film acoustic wave device that uses the silicon (Si) semiconductor substrate 25, when compensating the thickness distribution of the piezoelectric thin film 17 on top of the wafer 11, even if the amount of frequency variation to compensate was same as the film acoustic wave device that uses the gallium arsenide (GaAs) semiconductor substrate 14, the amount of change is different for length Le and width We of upper electrodes 18a and 18b, distance Wa between the electrodes 18a and 18b, length La and width Lg of connecting patterns 19a and 19b, and areas of bonding pads 20a and 20b for the film acoustic wave device 12.

Embodiment 9

Figure 22:
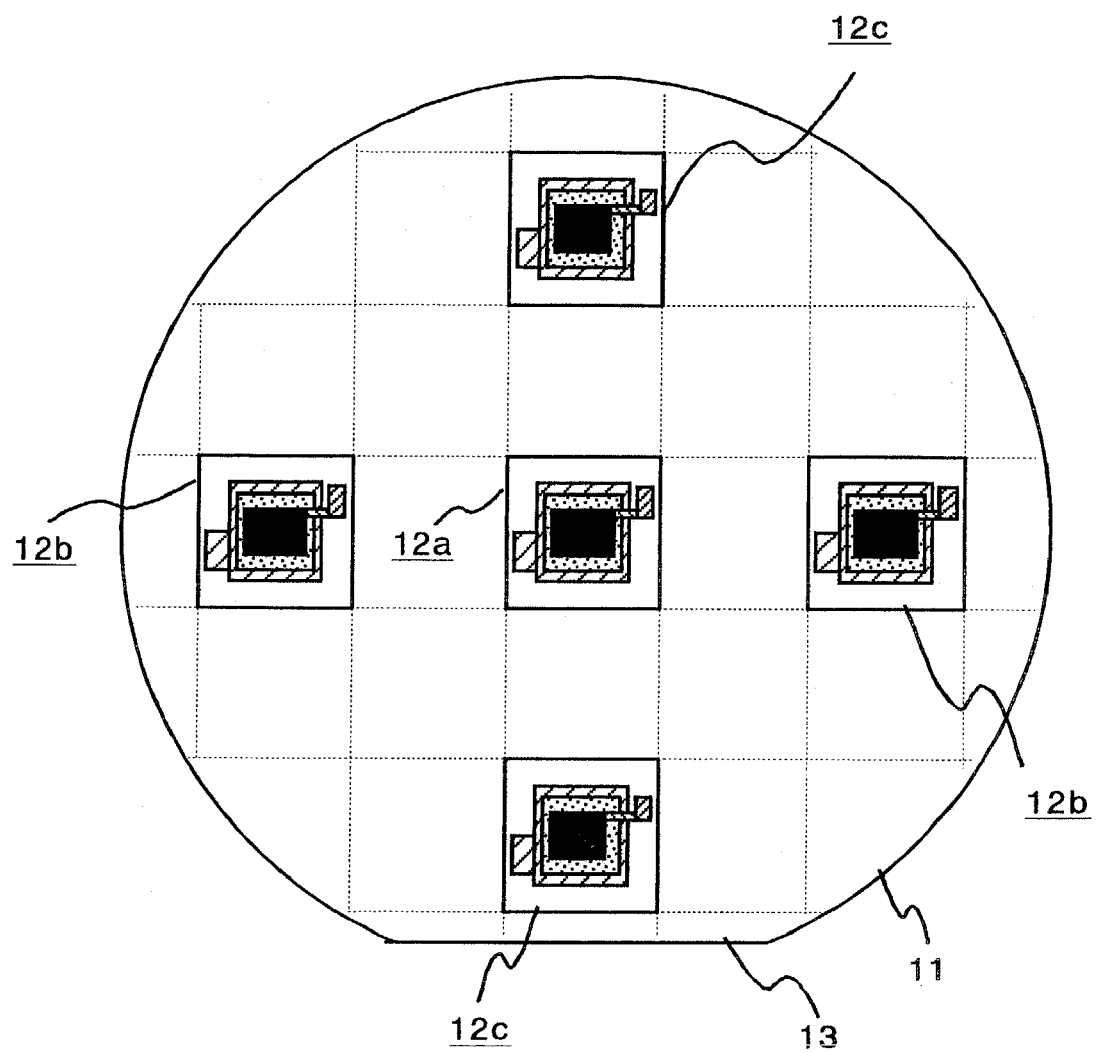
FIG. 22 illustrates the film acoustic wave device for embodiment 9.
Figure 23:
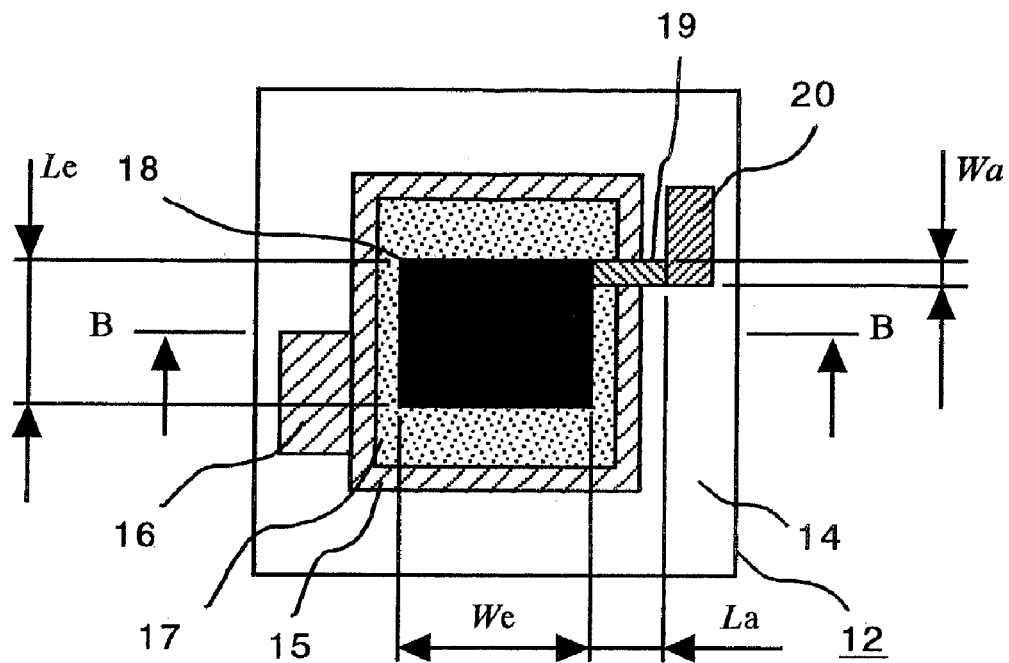
FIG. 23 is the enlarged diagram of the film acoustic wave device of FIG. 22.
Figure 24:
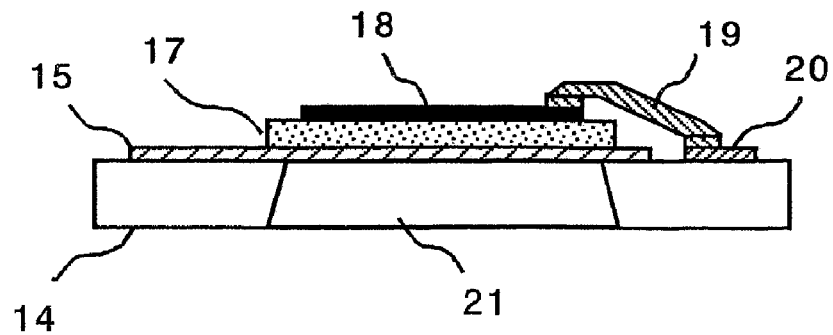
FIG. 24 is the cross-section of the film acoustic wave device of FIG. 23.

FIGS. 22, 23 and 24 illustrate the film acoustic wave device for embodiment 9.

A description of the numbered components indicated in the figures follows: the wafer 11 made of gallium arsenide (GaAs) semiconductor; the film acoustic wave devices 12a~12c; the orientation flat 13 showing the standard surface of the wafer 11; the gallium arsenide (GaAs) semiconductor substrate 14; the ground electrode 15; the bonding pad 16 at equal as ground electric potential with the ground electrode 15; the piezoelectric thin film 17 using PZT ($PbTiO_3$—$PbZrO_3$); the upper electrode 18; the connecting pattern 19; the bonding pad 20 connected to the upper electrode 18; and the via hole 21.

FIG. 22 is one of the examples which shows change in pattern shape by positioning the film acoustic wave device on top of the wafer 11.

In FIG. 22, in a direction parallel to the orientation flat 13, from the central wafer 11 for the film acoustic wave device 12a to the peripheral wafer 11 for the film acoustic wave device 12b has the same shape. Along a direction perpendicular to the orientation flat 13, as approaches the peripheral wafer 11 of the film acoustic wave device 12c, the bonding pad 20, the width We of upper electrode 18 and the length La of connecting pattern 19 have changed. This is a suitable method for such cases as changing the shape when the thickness distribution of piezoelectric thin film 17 on top of the wafer 11 is mostly uniform in the direction parallel to the orientation flat 13, and is changing the shape in direction perpendicular to the orientation flat 13.

FIG. 23 illustrates the bulk acoustic wave resonator of the film acoustic wave device 12 of the present embodiment. The bulk acoustic wave resonator is different from the bulk acoustic wave filter of FIG. 2 in that there is only one upper electrode 18. So in this embodiment, the part equivalent to the only one upper electrode 18 is used as the equivalent circuit as in FIG. 4. The film acoustic wave device 12 shown in FIG. 23 operates as one-port resonator. Unlike the properties of the filter shown in FIG. 6, properties of this resonator has a resonant frequency and anti-resonant frequency. Due to this, changes in the thickness of piezoelectric thin film 17 becomes a direct change of the resonant frequency and the anti-resonant frequency. In this type of resonator, the changes in resonant frequency and the anti-resonant frequency are made by connecting the resonator to a reactance device. In the film acoustic wave device 12 shown in FIG. 23, the length Le and width We of upper electrode 18 is determines mostly an impedance of the resonator. The connecting pattern 19 and bonding pad 20 are equivalent to the reactance device connected to the resonator. The length La and the width Wa of the connecting pattern 19 and the area of bonding pad 20 determines the element value of reactance connected to the resonator.

Thus, by changing the length La and width Wa of connecting pattern 19 and the area of bonding pad 20, the anti-resonant frequency and the resonant frequency for the resonator is changed. Furthermore, by changing the length Le and width We of upper electrode 18, a relation between the impedance of resonator and a value of the impedance of reactance connected to the resonator is changed. Similar to cases in FIGS. 10 to 18, by changing the length Le and width We of upper electrodes 18, length La and width Wa of connecting patterns 19, and area of bonding pad 20, the anti-resonant frequency and the resonant frequency of the resonator are changed. There is also the same effect from changing the capacitance of capacitor connected electrically to the bonding pad 20 and changing the area of bonding pad 20.

Embodiment 10

Figure 25:
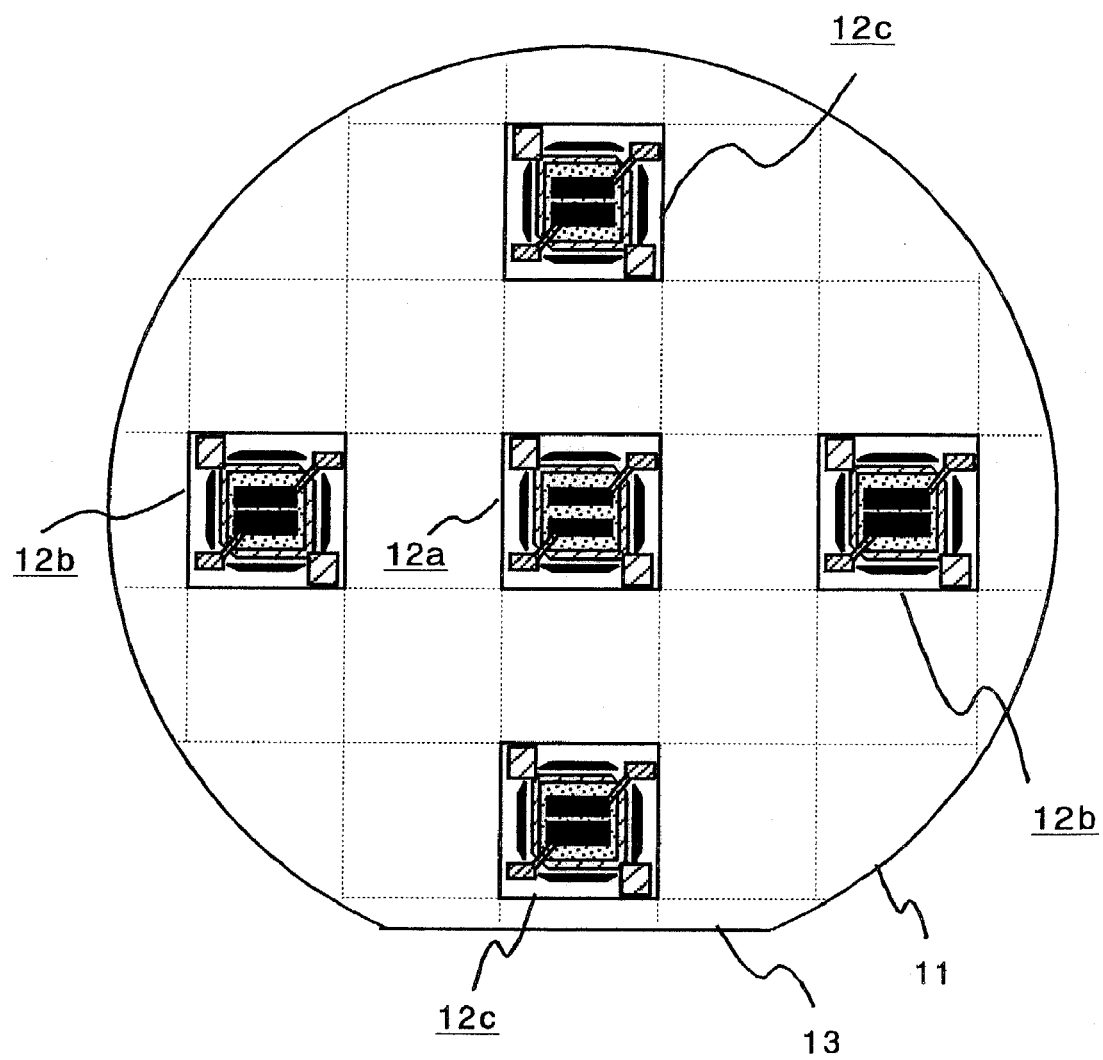
FIG. 25 illustrates the film acoustic wave device for embodiment 10.

FIG. 25 illustrates the piezoelectric thin film for embodiment 10.

Figure 26:
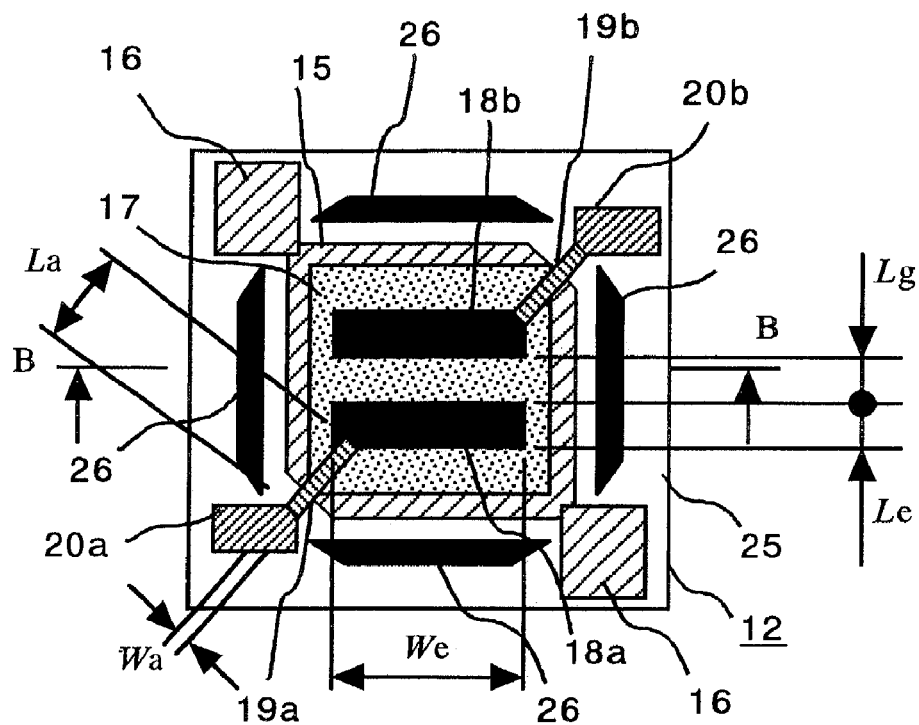
FIG. 26 is the enlarged diagram of the film acoustic wave device of FIG. 25.
Figure 27:
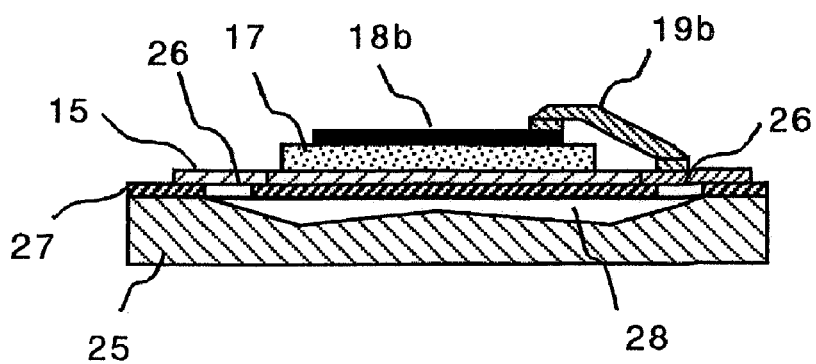
FIG. 27 is the cross-section of the film acoustic wave device of FIG. 26.

FIG. 26 is an enlarged view of the film acoustic wave device of FIG. 25. FIG. 27 is a cross-sectional view B—B of FIG. 26.

A description of the numbered components indicated on the figures follows: the wafer 11 made of silicon (Si) semiconductor; the film acoustic wave devices 12a~12c; the orientation flat 13 showing standard surface of the wafer 11; the silicon (Si) semiconductor substrate 25; the ground electrode 15; the bonding pad 16 in equal electric potential with the ground electrode 15; the piezoelectric thin film 17 made of zinc oxide (ZnO); the upper electrodes 18a and 18b; the connecting patterns 19a and 19b; the bonding pads 20a and 20b respectively connected to the upper electrodes 18a and 18b; an etching hole 26; a dielectric thin film 27; and a hole 28.

In FIG. 25, for the central wafer 11 of film acoustic wave device 12a, going away from the central wafer 11 concentrically, the shape of film acoustic wave device is changed, for example, the length Le of upper electrodes 18a and 18b, and the distance Lg between upper electrodes are changed similarly to the case of peripheral wafer 11 parallel to the direction of orientation flat 13 for the film acoustic wave device 12b, and the peripheral wafer 11 perpendicular to the direction of orientation flat 13 for the film acoustic wave device 12c. For such central wafer 11, most suitable case to apply the method of changing the shape of film acoustic wave device concentrically is when the thickness of piezoelectric thin film 17 varies concentrically.

To the film acoustic wave device 12 shown in FIGS. 26 and 27, the hole 28 located beneath the ground electrode 15 is made from frontal side of the upper electrodes 18a and 18b, by opening the etching hole 26 on the dielectric thin film 27 and removing part of the silicon (Si) semiconductor substrate by an anisotropic etching from the etching hole 26. The acoustic resonance of film acoustic wave device 12 is satisfied with this air layer underneath the ground electrode 15. The method of opening the etching hole 26 via hole 21 can be made from the front as shown in FIG. 27 or from the back as shown in FIG. 24. In any which way, the properties of the film acoustic wave device 12 remain the same. Furthermore, in FIG. 27, between the semiconductor substrate 25 and ground electrode 15, there is the dielectric thin film 27, however, although it is omitted in the drawings of FIGS. 21 and 24, there are the dielectric thin films 27 for the actual film acoustic wave device 12.

Embodiment 11

Figure 28:
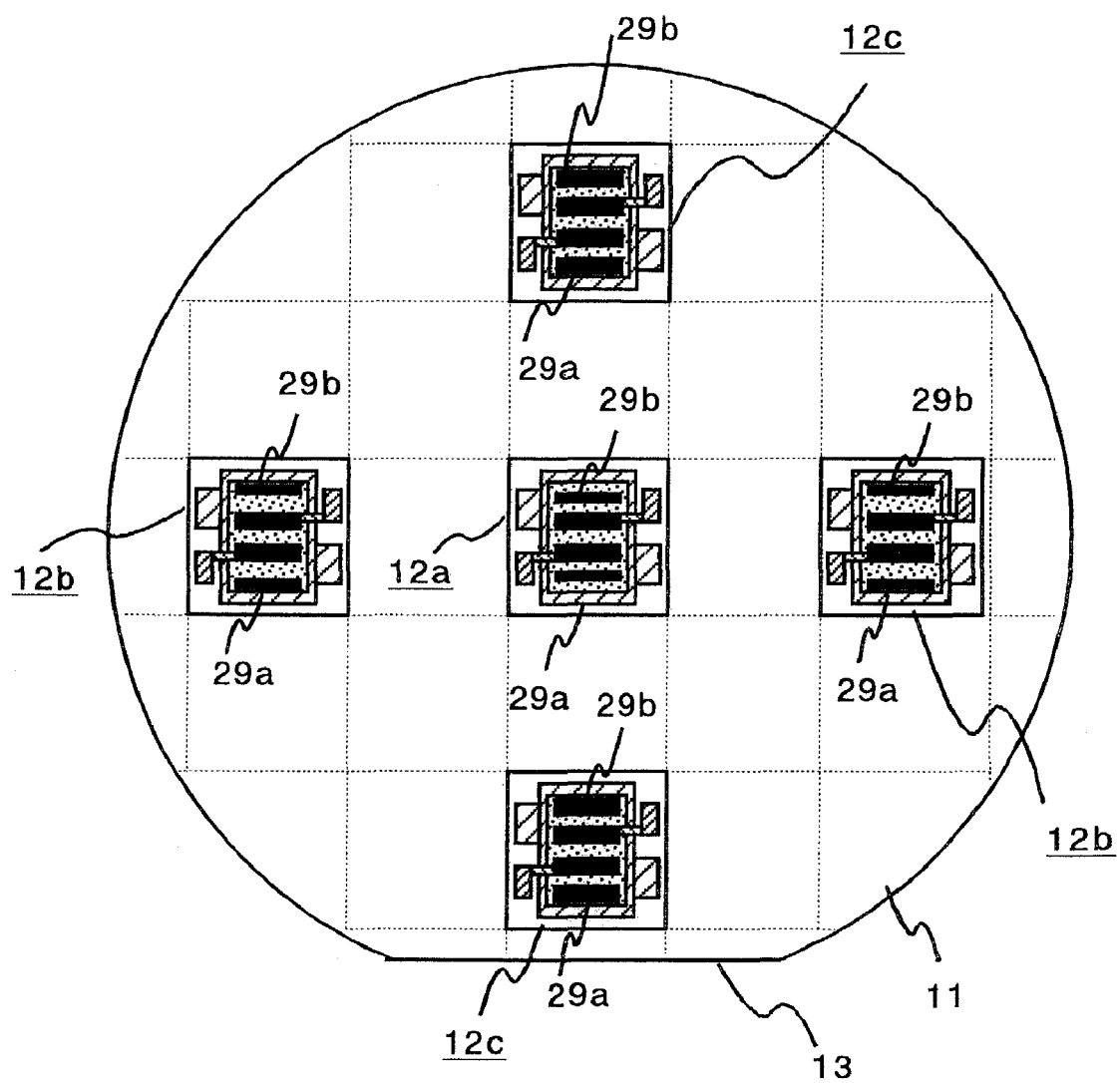
FIG. 28 illustrates the film acoustic wave devices for embodiment 11.

FIG. 28 illustrates the film acoustic wave device for embodiment 11.

Figure 29:
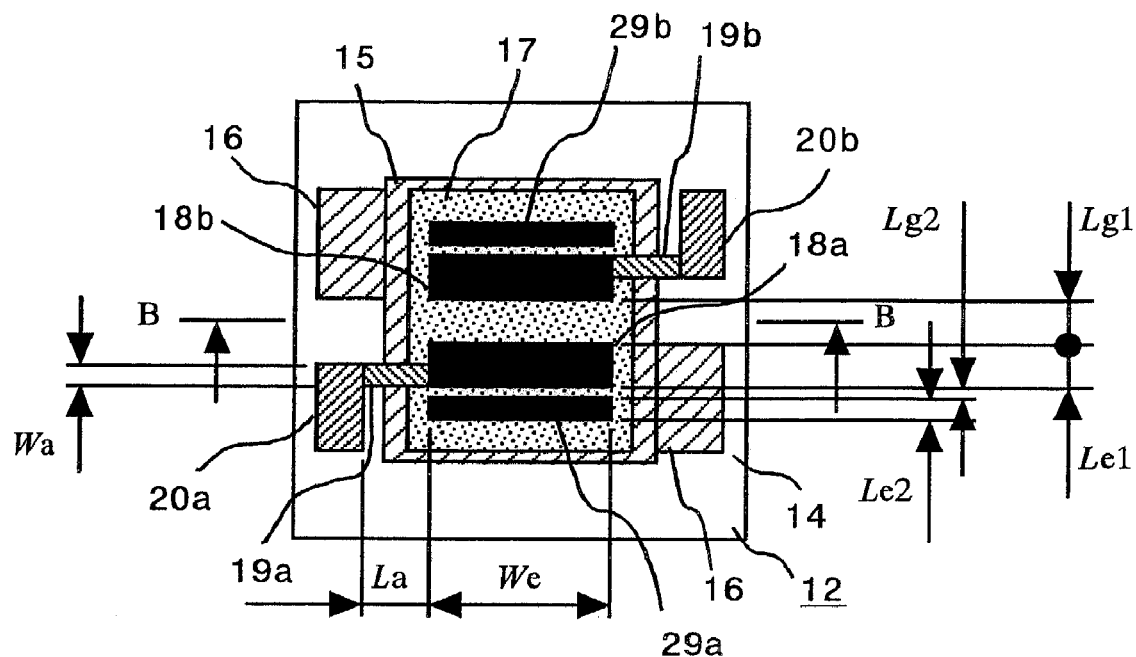
FIG. 29 is the enlarged diagram of the film acoustic wave device of FIG. 28.
Figure 30:
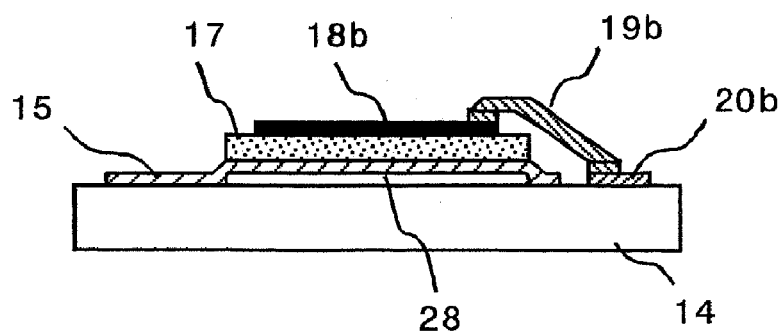
FIG. 30 is the cross-section of the film acoustic wave device of FIG. 29.

FIG. 29 is the enlarged diagram shown in FIG. 28. FIG. 30 is the cross-sectional view B—B of FIG. 29.

A description of the numbered components indicated in the figures follows: the wafer 11 made of gallium arsenide (GaAs) semiconductor substrate; the film acoustic wave devices 12a~12c; the orientation flat 13 showing the standard surface of the wafer 11; the gallium arsenide (GaAs) semiconductor 14; the ground electrode 15; the bonding pads 16 in equal electric potential to the ground electrode 15; the piezoelectric thin film 17 made of aluminum nitride (AlN); the upper electrodes 18a and 18b; the connecting patterns 19a and 19b; the bonding pads 20a and 20b respectively connected to the upper electrodes 18a and 18b; the hole 28, a second electrode 29a that is not connected electrically to upper electrode 18a; and a second electrode 29b that is not electrically connected to 18b.

In FIG. 28 of the present embodiment, length Le2 of the second electrodes 29a and 29b, and distance Lg2 between the upper electrode 18a and the second electrode 29a are changed. The distance Lg2 is also a distance between the second electrode 29b and the upper electrode 18b. As opposed to central part of the wafer 11 of the film acoustic wave device 12a, in the direction parallel to the orientation flat 13, as approach closely to the peripheral wafer 11 of the film acoustic wave device 12b, distance Lg2 between the second electrode 29a and upper electrode 18a (also the distance Lg2 between the second electrode 29b and the upper electrode 18b) are changed. In the direction perpendicular Lg2 to the orientation flat 13, as approach the peripheral wafer 11 of the film acoustic wave device 12c, the distances between the upper electrodes 18a and 18b with the second electrodes 29a and 29b, and length Le2 of the second electrodes 29a and 29b are changed. Such method, for example, can be adopted not only when the thickness h of the piezoelectric thin film 17 is distributed, but also when the change in properties of the film acoustic wave device at the wafer 11 are differing at direction parallel and direction perpendicular to the orientation flat, due to the change in the component ratio of materials which the piezoelectric thin film 17 is being made of. For instance, in the direction parallel to the orientation flat 13, the passband of film acoustic wave device 12b changes and in the direction perpendicular to the orientation flat 13, the passband and the band width of the film acoustic wave device 12c are changed, and in direction parallel to the orientation flat 13, passband of the film acoustic wave device 12b is compensated, and in the perpendicular direction both band width and passband of the film acoustic wave device 12c need be compensated, and need to change the way to change the forms of film acoustic wave device in directions parallel and perpendicular to the orientation flat 13.

FIG. 29 is the enlarged view of the film acoustic wave devices 12a, 12b and 12c of FIG. 28. FIG. 30 is cross-section B—B of FIG. 29.

The hole 28 is made without etching the gallium arsenide (GaAs) semiconductor substrate 14 on the lateral side of ground electrode 15. In this case, the properties of bulk acoustic wave filter is almost exactly same as the case of etching the gallium arsenide (GaAs) semiconductor substrate 14.

Embodiment 12

Figure 31:
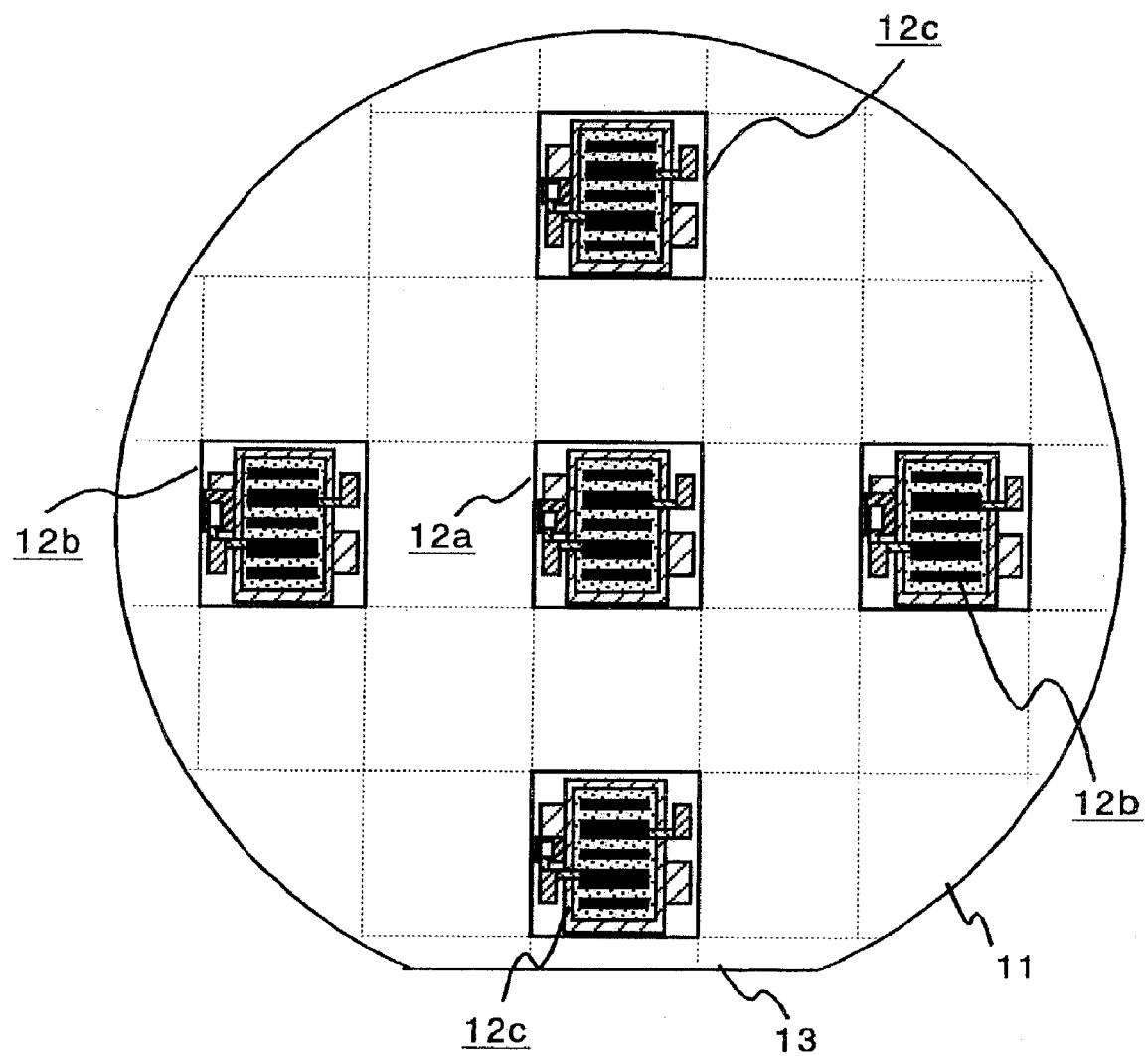
FIG. 31 illustrates the film acoustic wave devices for embodiment 12.
Figure 32:
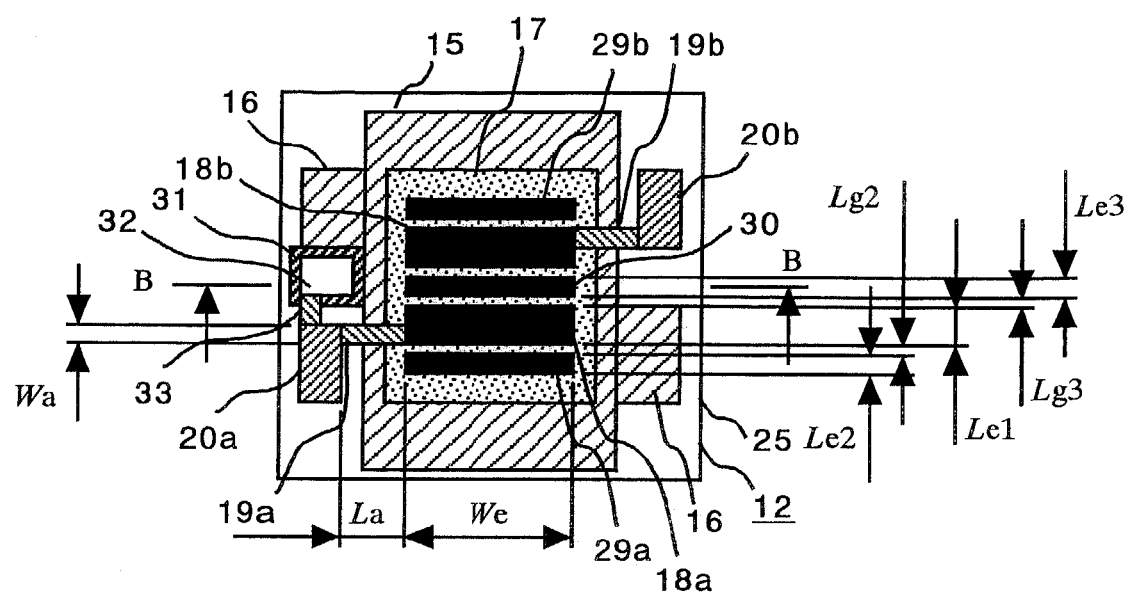
FIG. 32 is the enlarged diagram of the film acoustic wave device of FIG. 31.
Figure 33:
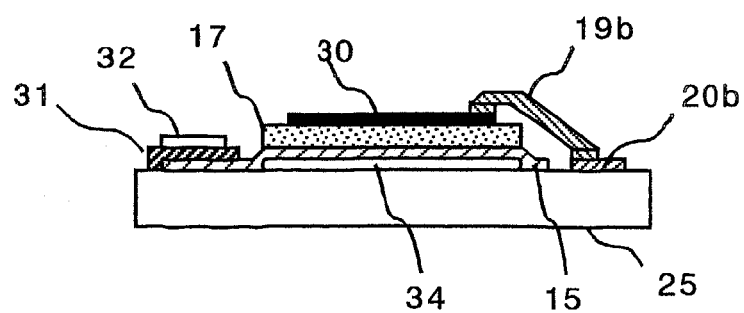
FIG. 33 is the cross-section of the film acoustic wave device of FIG. 32.
Figure 34:
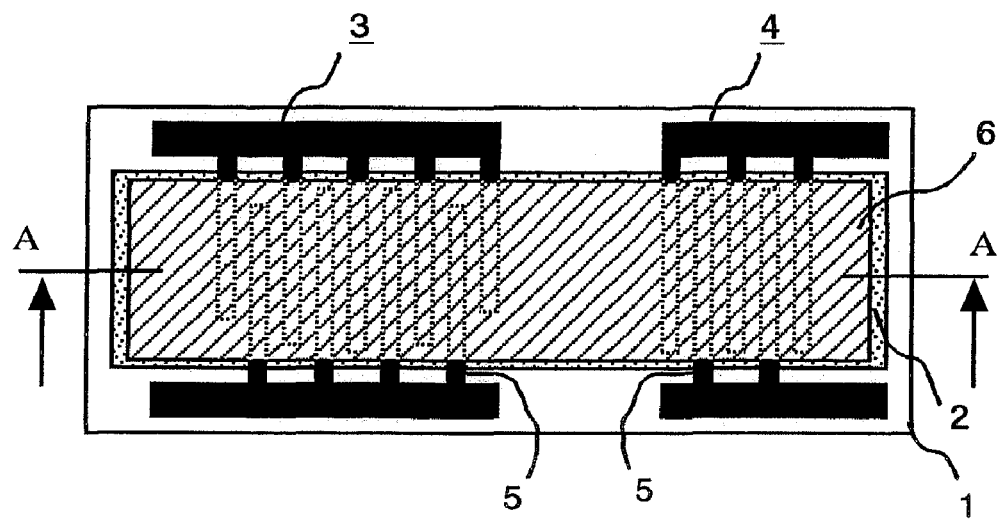
FIG. 34 illustrates a conventional type of the film acoustic wave device.
Figure 35:
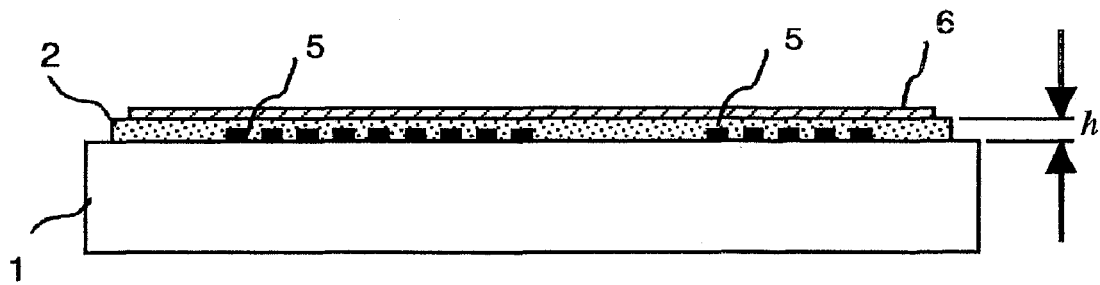
FIG. 35 is the cross-section of the conventional type of film acoustic wave device of FIG. 34.
Figure 36:
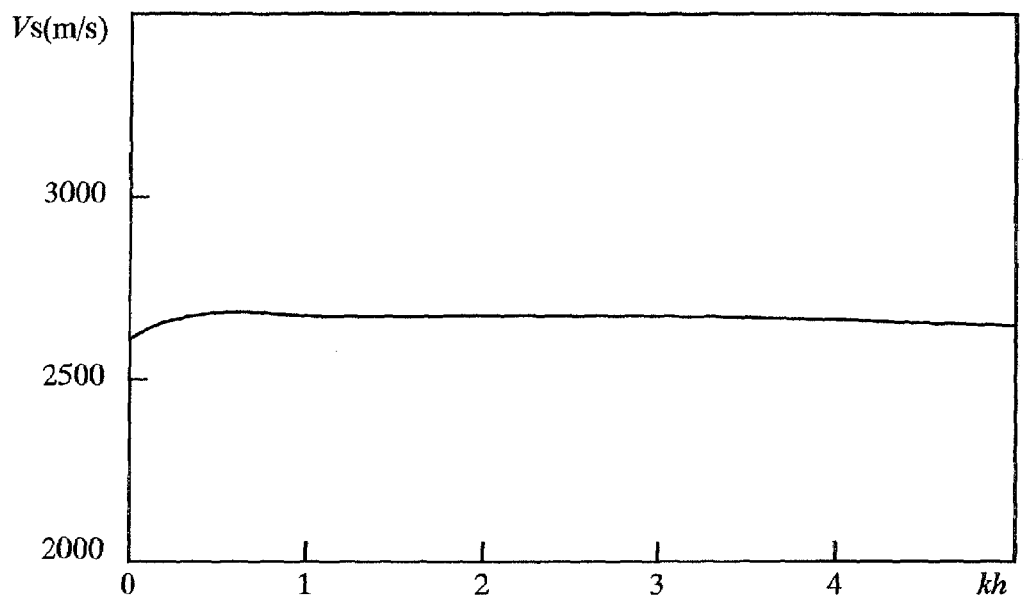
FIG. 36 is the graph showing a relationship of the acoustic velocity and the normalized thickness of thin film for the conventional type of film acoustic wave device as in FIGS. 34 and 35.
Figure 37:
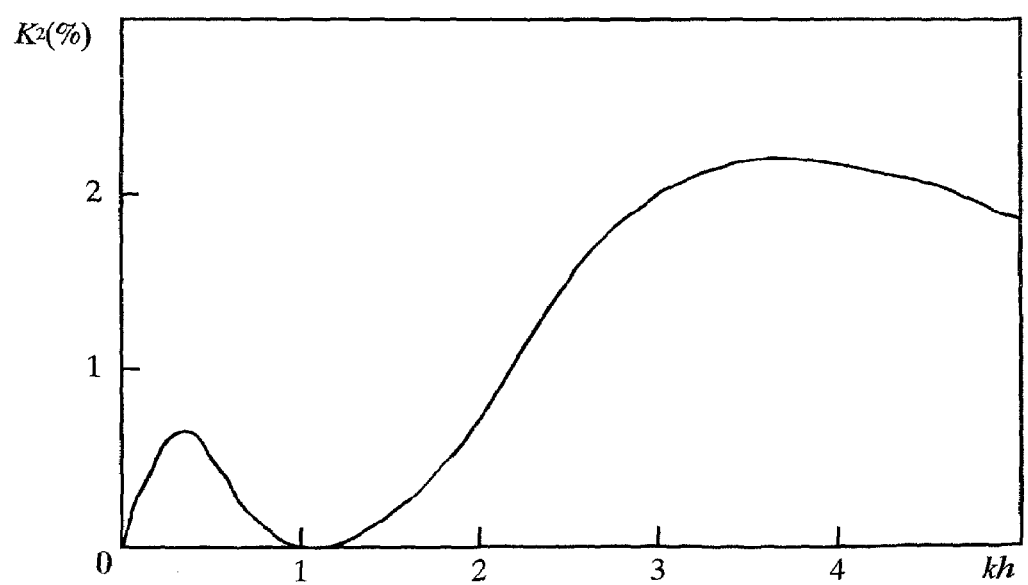
FIG. 37 is the graph showing the relationship between the normalized thickness and the electromechanical coupling constant for the conventional type of film acoustic wave device as in FIGS. 34 and 35.
Figure 38:
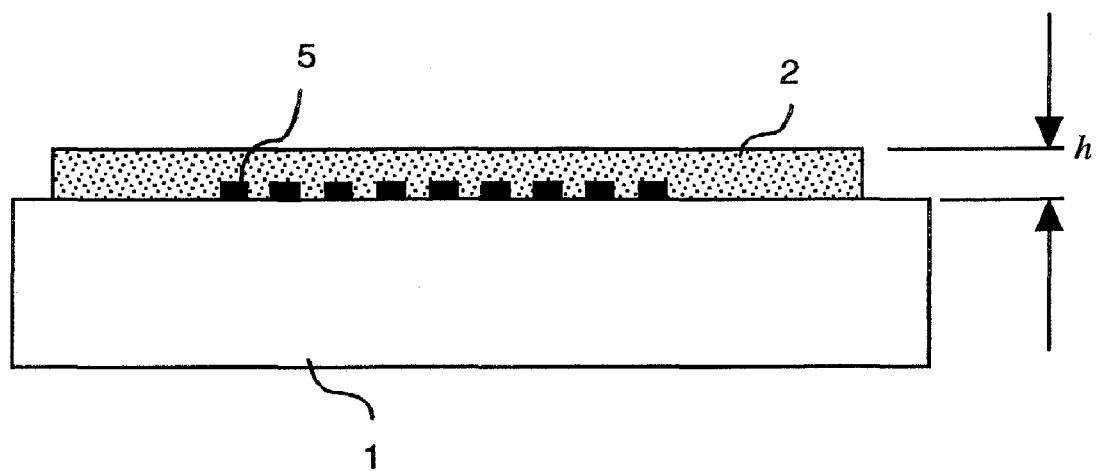
FIG. 38 illustrates the conventional type of film acoustic wave device.
Figure 39:
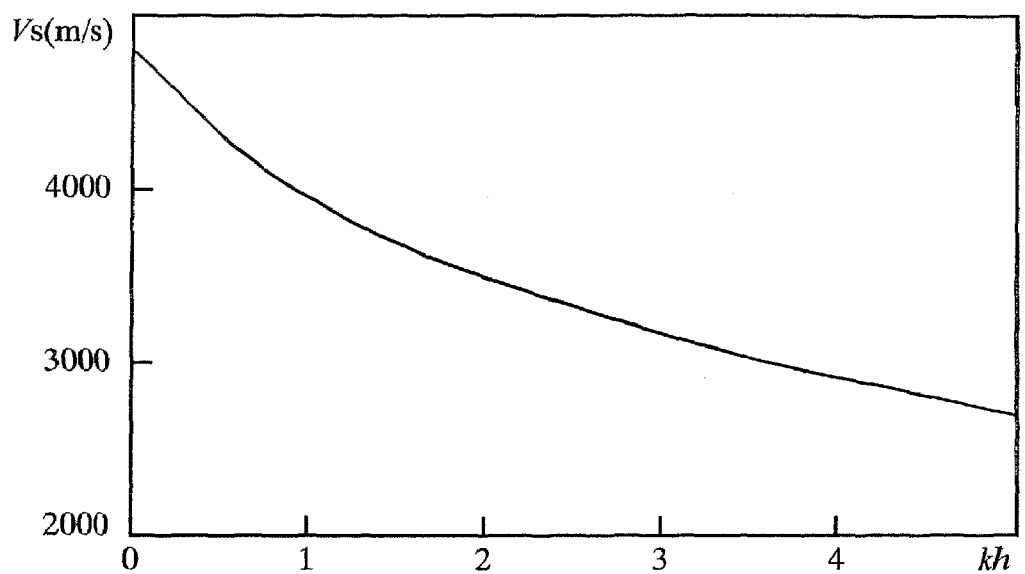
FIG. 39 is the graph showing the relationship between the normalized thickness of thin film and the acoustic velocity for the conventional type of film acoustic wave device of FIG. 38.
Figure 40:
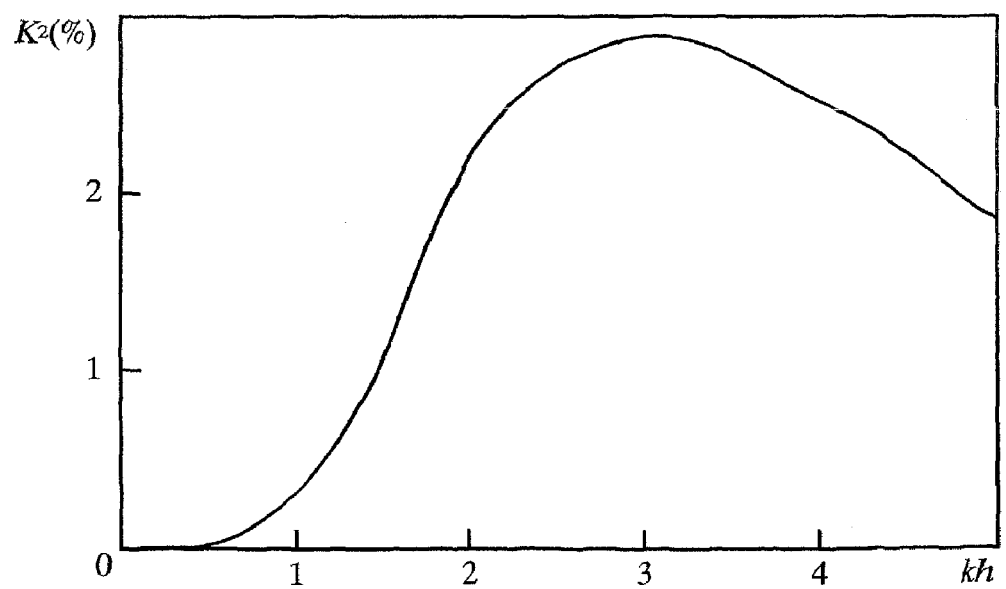
FIG. 40 is the graph showing the relationship between the electromechanical coupling constant and the normalized thickness of thin film for the conventional type of film acoustic wave device of FIG. 38.
Figure 41:
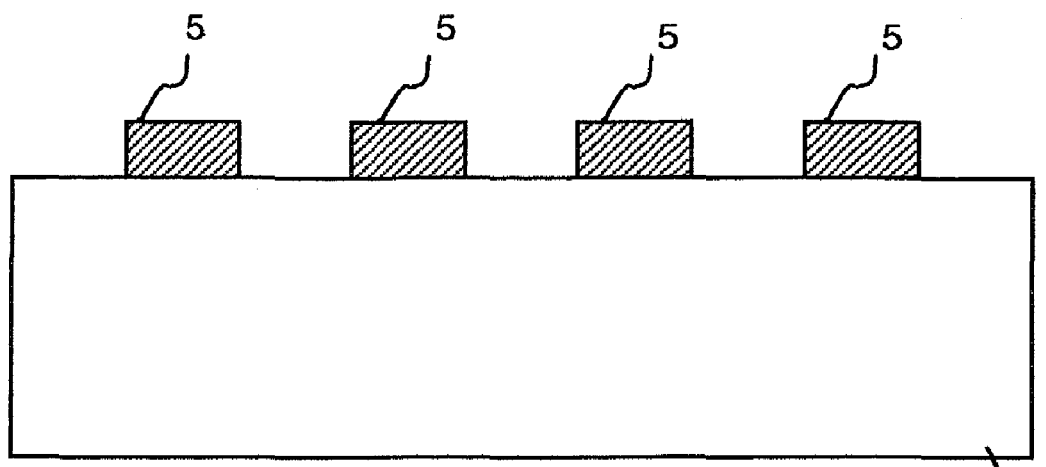
FIG. 41 illustrates a frequency adjustment method for the conventional type of film acoustic wave device.
Figure 41:
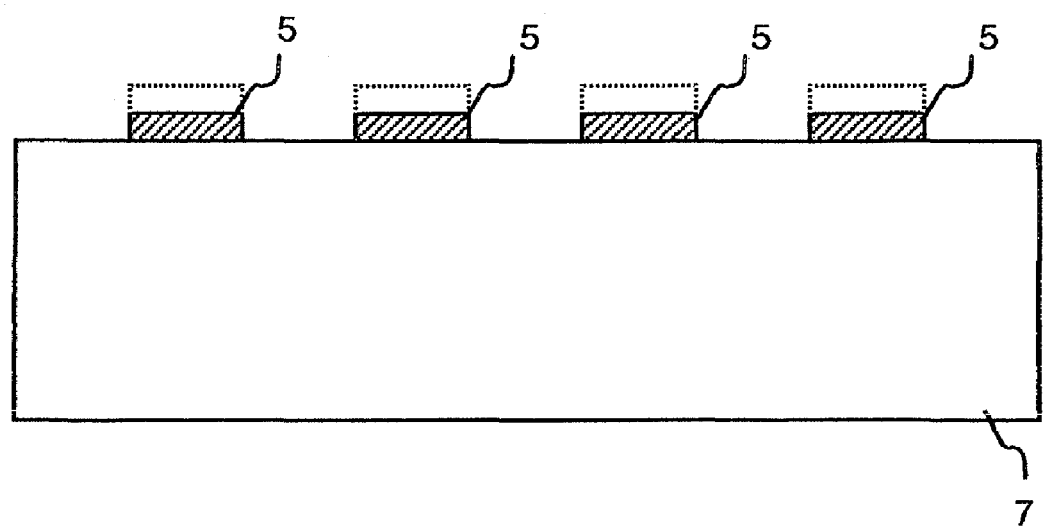
Figure 42:
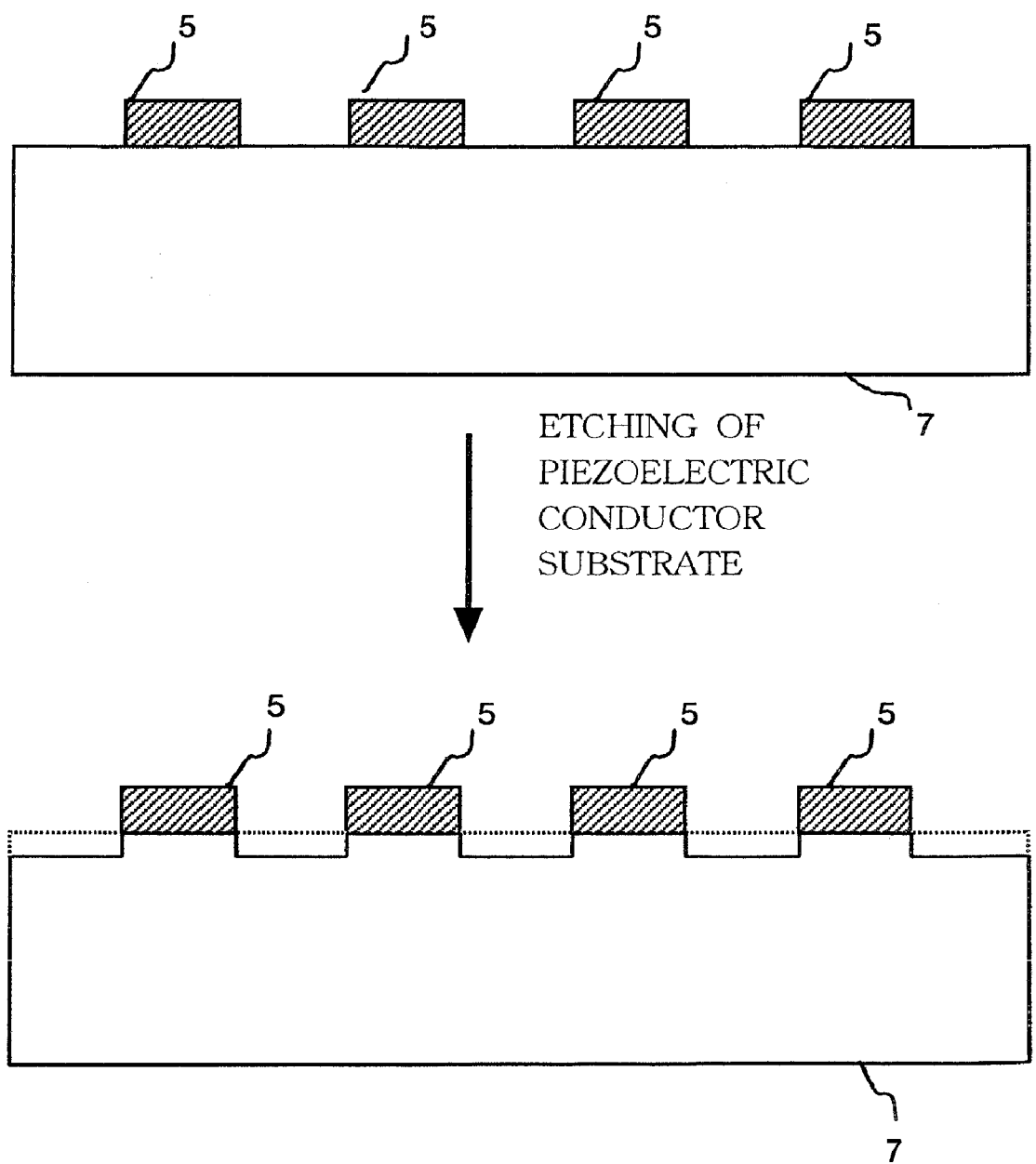
FIG. 42 illustrates a frequency adjustment method for the conventional type of film acoustic wave device.
Figure 43:
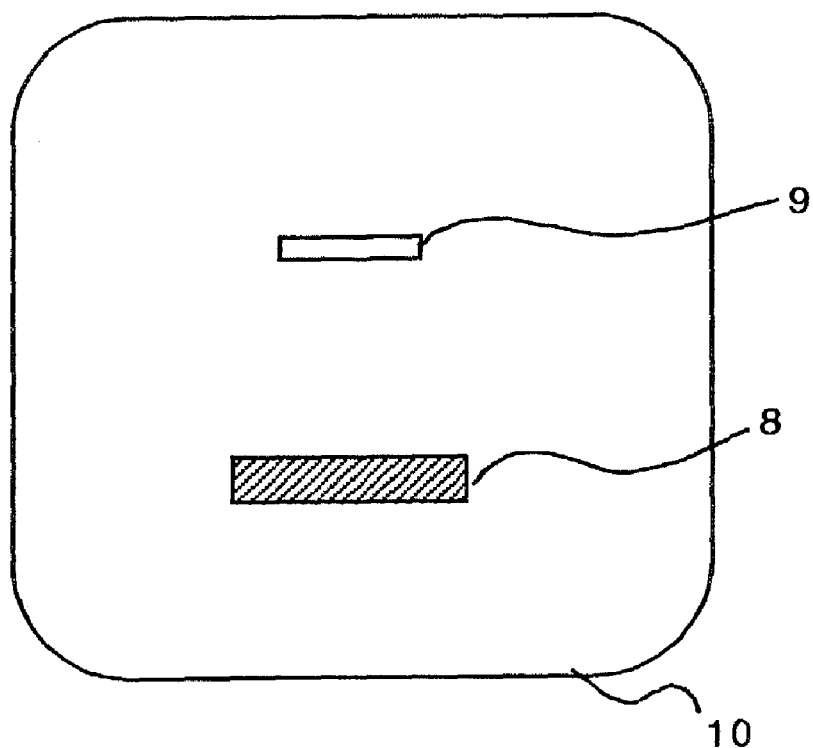
FIG. 43 is an apparatus for forming the piezoelectric thin film showing an example of wafer and target arrangement.

FIGS. 31, 32 and 33 illustrate the acoustic wave for embodiment 12.

A description of the numbered components indicated on the figures follows: the wafer 11 made of silicon (Si)

semiconductor; the film acoustic wave devices 12a–12c; the orientation flat 13 showing standard surface of the wafer 11; the silicon (Si) semiconductor substrate 25; the ground electrode 15; the bonding pads 16 at equal electric potential with the ground electrode 15; the piezoelectric thin film 17 made of lead titanate (PbTiO$_3$); the upper electrode of input side 18a; the upper electrode of output side 18b; the connecting patterns 19a and 19b; the bonding pads 20a and 20b connected respectively to the upper electrodes 18a and 18b; the second electrodes 29a and 29b that are not electrically connected to the upper electrodes 18a and 18b as in embodiment 11; a third electrode 30 that are not electrically connected to the upper electrodes 18a and 18b; an inductor 31; an electrode of capacitor 32; a connecting electrode 33 which electrically connects bonding pad 20a to the electrode of capacitor 32; and a dielectric substance layer 34 made of multi-layer of materials with various acoustic properties which function similarly to the hole 28.

In FIGS. 31 to 33 of the present embodiment, an area of the capacitor electrode 32 is changed depending on the positioning at wafer 11. Resulting in approximately same effect as changing the capacitor $C_{s1}$ of the equivalent circuit in FIG. 4 the variation in property of the film acoustic wave device 12 on top of the wafer 11 is compensated.

FIG. 32 is the enlarged view of the film acoustic wave devices 12a, 12b and 12c of FIG. 31. The third electrode 30 is placed in between the upper electrode of input side 18a and the upper electrode of output side 18b.

FIG. 33 is the cross-section B—B of FIG. 32. In between the bonding pad of an input side 20a and the bonding pad of a connecting side 16, a capacitor comprising the inductor 31 and the capacitor electrode 32 is electrically connected in parallel with the connecting electrode 33. In FIG. 32 only the bonding pad of input side 20a is connected to the capacitor, however, the bonding pad of output side 20b can also be connected similarly. It is possible to change at least either one of the length Le3 of the third electrodes 30 and the distance Lg3 between the third electrodes 30 and the upper electrodes 18a and 18b.

For property variations that occurs at the wafer 11, for example, a resonant frequency variation caused from the thickness distribution of the piezoelectric thin film 17, the resonant frequency can be compensated by changing the pattern shape of the film acoustic wave device 12, depending on the position at the wafer 11, to obtain the film acoustic wave devices with the same properties that does not depend on the positioning at wafer 11.

As such, when changing the pattern for the film acoustic wave device 12, there is a limit to an extent of the compensation. This limit varies with the type of piezoelectric thin film 17, type of upper electrodes 18a and 18b, type of ground electrode 15, type of dielectric film 27, thickness of piezoelectric thin film 17, thickness of upper electrodes 18, 18a and 18b, thickness of ground electrode 15, thickness of dielectric film 27 being used in the film acoustic wave device 12, and the pattern of film acoustic wave device. Especially the type of piezoelectric thin film 17 is a major factor limiting the extent of compensation. In general, a larger the electrochemical coupling factor of the piezoelectric thin film 17, the greater the extent of compensation. The electromechanical coupling constant has a large correlation with equivalent voltage coefficient e in the calculation examples of FIGS. 6 to 18.

For use in the piezoelectric ceramics with lead, materials such as lead titanate (PbTiO$_3$) and PZT (PbTiO$_3$—PbZrO$_3$) show excellent properties of the electromechanical coupling constant. In addition, these type of piezoelectric ceramics with lead are formed under a high temperature when making the thin film, therefore, the ceramics has a high melting point that it is essential to use chemically stable elements such as platinum (Pt) or gold (Au) for the ground electrode 15, and gallium arsenide (GaAs) semiconductor substrate and silicon (Si) semiconductor substrate as the substrate. Especially, Platinum (Pt) is excellent in the chemical stability. Lead titanate (PbTiO$_3$) is excellent material for Q, especially so as a material for a device that pre-conditions the use high frequency greater than GHz such as the film acoustic wave device. On the other hand, compared to other materials as zinc oxide (ZnO) or aluminum nitride (AlN), due to numerous type of material compositions, it is difficult to form the film with uniform composition throughout the wafer 11, that it becomes very important to compensate for property variation throughout the wafer 11. Using the PZT (PbTiO$_3$—PbZrO$_3$), the piezoelectric thin film 17 can have various properties by changing the ratio of constituents of lead titanate (PbTiO$_3$) and lead titanate-zirconate (PbZrO$_3$). A larger value of electromechanical coupling constant can be obtained using the PZT(PbTiO$_3$—PbZrO$_3$) compared to just the lead titanate (PbTiO$_3$). Such type of piezoelectric thin film has a greater advantage upon designing. However, since the PZT(PbTiO$_3$—PbZrO$_3$) includes a numerous type of material compositions more than the lead titanate (PbTiO$_3$), it becomes difficult to form a film uniformly, and the compensation for variation property throughout wafer 11 is important.

The electromechanical coupling constant of the piezoelectric ceramics that does not contain lead such as zinc oxide (ZnO) and aluminum nitride (AlN) are inferior to the piezoelectric ceramics with lead. However, they are characterized by a large value of Q. The large value of Q is ideal for a narrow band filter when configuring the filter. When the thickness of piezoelectric thin film 17 changes throughout the wafer 11 even slightly, the narrow band filter results in the lag of passband from the necessary area. It is important to compensate the thickness distribution of the piezoelectric thin film 17 throughout the wafer 11, especially important to compensate the property variations inside the wafer 11. Also, this type of piezoelectric ceramics that does not contain lead, a forming temperature of the piezoelectric thin film is relatively low. It is possible for this type of the piezoelectric ceramics to use the glass substrate other than semiconductor substrates such as gallium arsenide (GaAs) or silicon (Si). It is also possible for this type of piezoelectric ceramics to use the ground electrode 15 other than platinum (Pt) or gold (Au), and even possible to use materials with low melting point such as aluminum (Al).

The film acoustic wave device 12 has illustrated a multiple number of combinations of parameters namely: upper electrode 18, 18a and 18b; distance Lg between the upper electrode of input side 18a and upper electrode of output side 18b; length La and width Wa of connecting patterns 19, 19a and 19b; area of bonding pads 20, 20a, 20b; area of capacitor electrode 32 connected electrically to bonding pads 20a and 20b; length Le2 of second electrode 29a and 29b; distance Lg2 between second electrodes 29a and 29b to upper electrodes 18a and 18b; length Le3 of third electrode 30; distance Lg3 between the third electrode and upper electrodes 18a and 18b. With these examples, as shown in FIGS. 8 to 18, changing one of the parameters is sufficient for the compensation.

On the other hand, there are effective combinations of parameters that are not illustrated in the embodiments. The parameters are: length Le and width We of upper electrodes 18, 18a and 18b; distance Lg between the upper electrode of input side 18a and the upper electrode of output side 18b; length La and width Wa of connecting patterns 19, 19a and 19b; area of bonding pads 20a and 20b; area of capacitor electrode 32 connected electrically to bonding pads 20a and 20b; length Le2 of second electrodes 29a and 29b; distance Lg2 between the second electrodes 29a and 29b with upper electrodes 18a and 18b; length Le3 of third electrode 30; distance Lg3 between the third electrodes 18a and 18b. That is, for optional combinations within these parameters, variation can be compensated at the top of wafer 11.

In embodiments of the present invention, pattern of the film acoustic wave devices shown in the FIGS. 7, 9, 11, 13, 15, 17, 19, 20, 22, 23, 25, 26, 28, 29, 31 and 32 are some of the examples. There is no requirement to limit the pattern, and the pattern change to influence the property of film acoustic wave device is selective.

Moreover, there is no need to limit the cross-sectional shape of film acoustic wave device to those shown on FIGS. 21, 24, 27, 30 and 33. For example, bulk acoustic wave resonator shown in FIG. 23 is used as series and parallel elements of a ladder filter. In this case, the same effect can be obtained. The same effect will also be obtained by any combinations of cross-sectional shapes of film acoustic wave devices shown in FIGS. 21, 24, 27, 30 and 33, and shapes of pattern of the film acoustic wave devices shown in FIGS. 7, 9, 11, 13, 15, 17, 19, 20, 22, 23, 25, 26, 28, 29, 31 and 32.

In previously described embodiments, within the pattern shape of film acoustic wave device, length Le and width We of upper electrodes 18, 18a and 18b; length La and width Wa of connecting patterns 19, 19a and 19b; area of bonding pads 20a and 20b; area of capacitor electrode 32 connected electrically to bonding pads 20a and 20b; length Le2 of second electrode 29a and 29b; distance Lg2 betwen second electrode 29a and 29b and upper electrodes 18a and 18b respectively; and distance Lg3 between the third electrode and upper electrodes 18a and 18b respectively, in order to change these parameters by the positioning at the top of the wafer, the example is given for one of an element a or b to change in equal amount the parameters mentioned above, however, for one of the elements a or b, the parameters can be changed in different amount. This means, for example, not only to change the length Le of upper electrodes 18a and 18b by position of the film acoustic wave device at the wafer 11, but also to make the length Le of upper electrode 18a and length Le of upper electrode 18b different of one film acoustic wave device. Another example, not only to change the distance Lg2 between the second electrode 29a and 29b and upper electrode 18a and 18b by position of the film acoustic wave device at wafer, but also to make the distance Lg2 between the second electrode 29a and upper electrode 18a different to the distance Lg2 between the upper electrode 18b and the second electrode 29b of one film acoustic wave device.

As such, by changing the parameters differently rather than changing the parameters equally, the extent of compensation is extended.

INDUSTRIAL APPLICABILITY

According to the present invention, by changing at least more than one of the pattern of film acoustic wave device, such as the length Le or width We of upper electrodes, the distance Lg between the upper electrodes of input/output side, the length La and width Wa of connecting pattern, the areas of bonding pads, the areas of electrode of capacitor connected electrically to bonding pads by the positioning at wafer, a variation of property for the film acoustic wave device that arises when positioning at wafer is reduced, and the film acoustic wave device with same properties that are not affected by the wafer positioning is obtained.

Without limiting the thickness of piezoelectric thin film, the type of materials for the film acoustic wave device or its combination, a variety of acoustic wave device that are useful in industries is achieved.

What is claimed is:

1. A wafer having a plurality of acoustical wave devices formed thereon and exhibiting common operational characteristics, each of said acoustical wave devices comprising:
   a ground electrode formed on the wafer;
   a piezoelectric thin film formed on the ground electrode, wherein the piezoelectric thin film varies in at least one characteristic across the wafer; and
   at least one upper electrode formed on the piezoelectric thin film;
   wherein at least the ground electrode, the piezoelectric thin film and the at least one upper electrode form components in each of the plurality of acoustical wave devices; and
   wherein at least one component in some of the plurality of acoustical wave devices is modified in its operational characteristic to compensate for the variation in the at least one characteristic of the piezoelectric thin film and is based on the location of the at least one acoustical wave devices on the wafer.

2. The wafer according to claim 1, wherein a length of the at least one upper electrode is dependent upon the position at which the film acoustic wave device is mounted on the wafer.

3. The wafer according to claim 1, wherein a width of the upper electrode is dependent upon the position at which the film acoustic wave device is mounted on the wafer.

4. The wafer according to claim 1 further including a plurality of upper electrodes, wherein
   distances between each of the plurality of upper electrodes are dependent upon the position at which the film acoustic wave device is mounted on the wafer.

5. The wafer according to claim 1 further comprising:
   a bonding pad for connecting with the at least one upper electrode, wherein
   the pattern shape of the film acoustic wave device is formed by at least the ground electrode, the piezoelectric thin film, the at least one upper electrode, and the bonding pad, and wherein
   a shape of the bonding pad is dependent upon the position at which the film acoustic wave device is mounted on the wafer.

6. The wafer according to claim 5 further comprising:
   a connecting pattern for connecting the upper electrode with the bonding pad, wherein
   the pattern shape of the film acoustic wave device is formed by at least the ground electrode, the piezoelectric thin film, the at least one upper electrode, the bonding pad, and the connecting pattern, and wherein
   a shape of the connecting pattern is dependent upon the position at which the film acoustic wave device is mounted on the wafer.

7. The wafer according to claim 6, wherein the connecting pattern forms an air bridge.

8. The wafer according to claim 1 further comprising:
a capacitor provided on the same wafer as the film acoustic wave device, wherein
a capacitance of the capacitor is dependent upon the position at which the film acoustic wave device is mounted on the wafer.

9. The wafer according to claim 1, wherein the wafer is made of gallium arsenide (GaAs), the piezoelectric thin film is made of lead titanate ($PbTiO_3$), and at least one upper electrode is a conductor substantially made of platinum (Pt).

10. The wafer according to claim 1, wherein the wafer is made of silicon (Si), the piezoelectric thin film is made of lead titanate ($PbTiO_3$), and at least one upper electrode is a conductor substantially made of platinum (Pt).

11. The wafer according to claim 1, wherein the piezoelectric thin film is made of PZT ($PbTiO_3$—$PbZrO_3$), and at least one upper electrode and the ground electrode is a conductor substantially made of platinum (Pt).

12. The wafer according to claim 1, wherein the piezoelectric thin film is made of zinc oxide (ZnO).

13. The wafer according to claim 1, wherein the piezoelectric thin film is made of aluminum nitride (AlN).

14. The wafer according to claim 1 further comprising:
an inductor positioned between the wafer and the ground electrode.

15. The wafer of claim 1, wherein the varied characteristic of the piezoelectric thin film is thickness.

16. The wafer of claim 15, wherein the piezoelectric thin film is thicker in the middle of the wafer and becomes thinner as it extends out towards the periphery of the wafer.

17. A plurality of acoustical wave device chips formed from a common wafer, each chip comprising:
a ground electrode formed on the wafer;
a piezoelectric thin film formed on the ground electrode, wherein the piezoelectric thin film varies in at least one characteristic across the wafer; and
at least one upper electrode formed on the piezoelectric thin film;
wherein at least the ground electrode, the piezoelectric thin film and the at least one upper electrode form components of the plurality of acoustical wave devices; and
wherein at least one component in at least some of the plurality of acoustical wave devices is modified in its operational characteristic to compensate for the variation in the at least one characteristic of the piezoelectric thin film and is based on the location of the at least one acoustical wave devices on the wafer.

18. The wafer of claim 17, wherein the varied characteristic of the piezoelectric thin film is thickness.

* * * * *